US011177415B2

(12) United States Patent
Streppel

(10) Patent No.: US 11,177,415 B2
(45) Date of Patent: Nov. 16, 2021

(54) PROJECTION OPTICAL UNIT, OPTOELECTRONIC SEMICONDUCTOR CHIP, OPTOELECTRONIC ILLUMINATION SYSTEM, CAMERA, TERMINAL

(71) Applicant: OSRAM Opto Semiconductors GmbH, Regensburg (DE)

(72) Inventor: Ulrich Streppel, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 291 days.

(21) Appl. No.: 16/083,771

(22) PCT Filed: Mar. 9, 2017

(86) PCT No.: PCT/EP2017/055590
§ 371 (c)(1),
(2) Date: Sep. 10, 2018

(87) PCT Pub. No.: WO2017/153539
PCT Pub. Date: Sep. 14, 2017

(65) Prior Publication Data
US 2019/0074413 A1    Mar. 7, 2019

(30) Foreign Application Priority Data
Mar. 10, 2016    (DE) ...................... 10 2016 104 385.0

(51) Int. Cl.
*H01L 33/50*    (2010.01)
*G02B 13/00*    (2006.01)
(Continued)

(52) U.S. Cl.
CPC .............. *H01L 33/504* (2013.01); *F21V 5/04* (2013.01); *G02B 3/04* (2013.01); *G02B 9/06* (2013.01);
(Continued)

(58) Field of Classification Search
CPC ......... H01L 33/504; H01L 33/58; F21V 5/04; G02B 3/04; G02B 9/06; G02B 19/0061
See application file for complete search history.

(56) References Cited

U.S. PATENT DOCUMENTS

2006/0050403 A1    3/2006  Neil
2011/0122638 A1*   5/2011  Konishi ................ F21S 41/143
                                                  362/519
(Continued)

FOREIGN PATENT DOCUMENTS

| DE | 35 05 771 C2 | 8/1985 |
|---|---|---|
| DE | 196 45 035 C1 | 4/1998 |
| DE | 10 2009 017 3 | 10/2010 |
| DE | 10 2011 077 5 | 12/2012 |
| DE | 10 2011 054 2 | 4/2013 |
| DE | 10 2013 003 5 | 9/2013 |
| DE | 10 2014 101 8 | 8/2015 |

(Continued)

*Primary Examiner* — Anne M Hines
(74) *Attorney, Agent, or Firm* — DLA Piper LLP (US)

(57) ABSTRACT

A projection optical unit that images electromagnetic radiation emitted by an optoelectronic semiconductor chip includes a first lens element, a second lens element, wherein the two lens elements each include a first light-refracting surface and a second light-refracting surface located opposite the first light-refracting surface, the second light-refracting surface of the first lens element faces the first light-refracting surface of the second lens element, and the four light-refracting surfaces each include an asphere-shaped surface section such that the respective surface section forms an aspherical lens.

19 Claims, 12 Drawing Sheets

(51) Int. Cl.
  *H01L 33/58* (2010.01)
  *G02B 19/00* (2006.01)
  *G02B 9/06* (2006.01)
  *F21V 5/04* (2006.01)
  *G02B 3/04* (2006.01)
  *H01L 27/15* (2006.01)

(52) U.S. Cl.
  CPC ....... *G02B 13/003* (2013.01); *G02B 19/0061* (2013.01); *H01L 33/58* (2013.01); *H01L 27/156* (2013.01)

(56) References Cited

U.S. PATENT DOCUMENTS

| | | |
|---|---|---|
| 2012/0126268 A1 | 5/2012 | Seo et al. |
| 2013/0208493 A1* | 8/2013 | Kloos ................ G02B 19/0014 362/521 |
| 2015/0241022 A1 | 8/2015 | Huang |

FOREIGN PATENT DOCUMENTS

| | | |
|---|---|---|
| EP | 1 962 516 A2 | 8/2008 |
| EP | 2 843 702 A1 | 3/2015 |
| JP | 2005-284003 A | 10/2005 |
| WO | 2008/015887 A1 | 2/2008 |
| WO | 2012/156121 A1 | 11/2012 |

* cited by examiner

PROJECTION OPTICAL UNIT, OPTOELECTRONIC SEMICONDUCTOR CHIP, OPTOELECTRONIC ILLUMINATION SYSTEM, CAMERA, TERMINAL

TECHNICAL FIELD

This disclosure relates to a projection optical unit that images electromagnetic radiation emitted by an optoelectronic semiconductor chip. The disclosure also relates to an optoelectronic semiconductor chip, an optoelectronic illumination system, a camera that records an image, and a terminal.

BACKGROUND

Light-emitting diode modules comprising an adjustable emission color have hitherto been implemented exclusively by the use of two spatially separated semiconductor chips or light-emitting diodes. Those emitters comprise either dedicated optical units, for example, Fresnel lenses, or a common micro-optical structure.

DE 10 2014 101 896 A1 discloses a method of producing an optoelectronic semiconductor component, and an optoelectronic semiconductor component. There is nonetheless a need to provide a means to efficiently illuminate an area.

SUMMARY

I provide a projection optical unit that images electromagnetic radiation emitted by an optoelectronic semiconductor chip including a first lens element, a second lens element, wherein the two lens elements each include a first light-refracting surface and a second light-refracting surface located opposite the first light-refracting surface, the second light-refracting surface of the first lens element faces the first light-refracting surface of the second lens element, and the four light-refracting surfaces each include an asphere-shaped surface section such that the respective surface section forms an aspherical lens.

I also provide an optoelectronic semiconductor chip including a plurality of individually drivable light-emitting pixels that each include a semiconductor layer sequence including an active zone that generates electromagnetic radiation, wherein the light-emitting pixels are respectively assigned a phosphor for a wavelength conversion of the electromagnetic radiation generated in the respective active zone, and the assigned phosphors in part each include a different conversion property.

I further provide an optoelectronic illumination system including the optoelectronic semiconductor chip including a plurality of individually drivable light-emitting pixels that each include a semiconductor layer sequence including an active zone that generates electromagnetic radiation, wherein the light-emitting pixels are respectively assigned a phosphor for a wavelength conversion of the electromagnetic radiation generated in the respective active zone, and the assigned phosphors in part each include a different conversion property and a projection optical unit that images electromagnetic radiation emitted by an optoelectronic semiconductor chip including a first lens element, a second lens element, wherein the two lens elements each include a first light-refracting surface and a second light-refracting surface located opposite the first light-refracting surface, the second light-refracting surface of the first lens element faces the first light-refracting surface of the second lens element, and the four light-refracting surfaces each include an asphere-shaped surface section such that the respective surface section forms an aspherical lens to image the converted electromagnetic radiation.

LIST OF REFERENCE SIGNS

Figure 1:
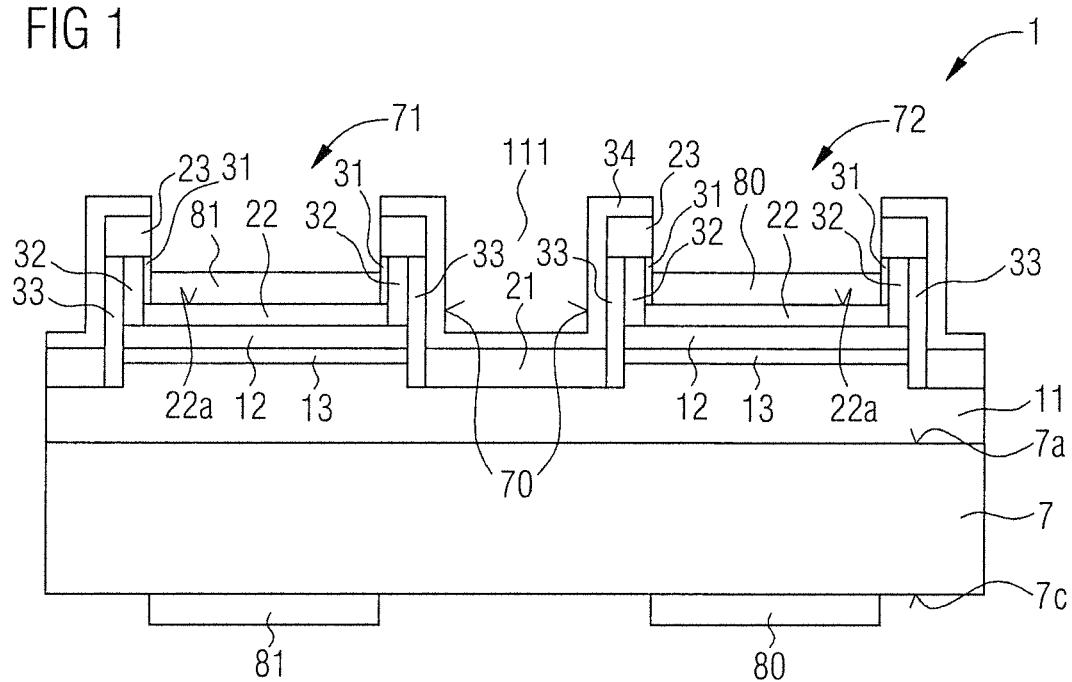
FIG. 1 shows a first optoelectronic semiconductor chip.

1 Optoelectronic semiconductor chip
11, 12, 13 Semiconductor layer sequence
11 n-conducting semiconductor layer
12 p-conducting semiconductor layer
13 Active zone 21 n-type contacting layer
22 p-type contacting layer
22a Top surface of the p-type contacting layer
23 Metallization layer
7 Carrier
7a Top side of the carrier
7c Underside of the carrier
70 Sidewall of the pixels
31 First isolation layer
32 Second isolation layer
33 Third isolation layer
34 Fourth isolation layer
71, 72 Pixel
111 Trench
80, 81 Phosphor
201 Optoelectronic semiconductor chip
203, 205 Light-emitting pixels
205 Light-emitting pixel with a first phosphor
207 Light-emitting pixel with a second phosphor
301 Abscissa
305 Ordinate
307 Spectral profile
401 Abscissa
405 Ordinate
407 Spectral profile
501 Abscissa
503 Ordinate
505 Planckian locus
507, 509 Points on the Planckian locus
511 Mixing straight line
601 Optoelectronic illumination system
603 Optoelectronic semiconductor chip
605 Projection optical unit
607 Light rays
609 Area
611 First lens element
613 Second lens element
615 First light-refracting surface of the first lens element
617 Second light-refracting surface of the first lens element
619 First light-refracting surface of the second lens element
621 Second light-refracting surface of the second lens element
623, 625, 627, 629 Aspherical lenses
631 Optical axis
633 Aperture stop
634 Aperture
701 Projection optical unit
703 First lens element
705 Second lens element
706 First light-refracting surface of the first lens element
707 Second light-refracting surface of the first lens element
709 First light-refracting surface of the second lens element
711 Second light-refracting surface of the second lens element
713, 715, 717 Aspherical lenses
719 First radial stretching direction
721 Second radial stretching direction
723 Lens centroid of the second lens element
801 Optoelectronic semiconductor chip
803 Light-emitting pixels
805 x, y, z-coordinate system
807 x-axis
809 y-axis
811 z-axis
1001 Center region
1301 Corner region
1401 x-axis
1403 y-axis
1405 Scale
1801 Camera
1803 Optoelectronic illumination system
1901 Terminal
1903 Camera
1905 Carrier
1907 First mount
1909 Second mount
2001 Housing

DETAILED DESCRIPTION

My projection optical unit that images electromagnetic radiation emitted by an optoelectronic semiconductor chip comprises:
a first lens element,
a second lens element,
wherein the two lens elements each comprise a first light-refracting surface and a second light-refracting surface located opposite the first light-refracting surface,
the second light-refracting surface of the first lens element faces the first light-refracting surface of the second lens element, and
the four light-refracting surfaces each comprise an asphere-shaped surface section such that the respective surface section forms an aspherical lens.

My optoelectronic semiconductor chip is provided comprises:
a plurality of individually drivable light-emitting pixels, which each comprise a semiconductor layer sequence comprising an active zone that generates electromagnetic radiation,
wherein the light-emitting pixels are respectively assigned a phosphor for a wavelength conversion of the electromagnetic radiation generated in the respective active zone, and
the assigned phosphors in part each comprise a different conversion property.

My optoelectronic illumination system comprises an optoelectronic semiconductor chip and a projection optical unit that images electromagnetic radiation emitted by an optoelectronic semiconductor chip that images the converted electromagnetic radiation.

My camera comprises an optoelectronic illumination system.

My terminal, in particular a mobile terminal, comprises a camera that records an image.

I thus provide a two-lens projection optical unit, wherein the two lenses comprise respectively opposite aspherical lenses. Providing aspherical lenses affords the technical advantage, in particular, that imaging aberrations present in the case of otherwise conventional spherical lenses may be avoided or reduced. In particular, this advantageously makes it possible to correct a spherical aberration at least partly, in particular completely.

I also provide an optoelectronic semiconductor chip comprising a plurality of individual drivable light-emitting pixels, wherein the phosphors assigned to the pixels in part each comprise a different conversion property. By providing different conversion properties and by the individually drivable light-emitting pixels, an emission color of the light emitted by the optoelectronic semiconductor chip may advantageously be set. Thus, to set a specific color, for example, it is now no longer necessary to provide two spatially separated individual emitters each comprising different emission colors as in known systems. As a result, an optoelectronic illumination system may advantageously be constructed more compactly. Consequently, by way of example, a required installation space for such an illumination system may advantageously be formed in smaller fashion compared to known illumination systems comprising two spatially separated emitters.

In particular, the technical advantage is afforded that a reduction in size and a homogenization of an appearance of an optical light emission face of the optoelectronic semiconductor chip may be brought about.

In particular, a homogeneous appearance of the phosphors in the switched-off state of the semiconductor chip is advantageously brought about since the human eye may not resolve the individual pixels, with the result that a phosphor layer that is homogeneous to the human eye appears.

Since a semiconductor chip comprises a plurality of light-emitting pixels, the semiconductor chip may also be referred to as a pixelated emitter.

An aspherical lens denotes a lens comprising at least one light-refracting face or light-refracting surface deviating from the spherical shape or plane shape.

An aspherical lens is defined, for example, by the following formula:

$$z(r) = \frac{cr^2}{1+\sqrt{1-(1+k)c^2r^2}} + \alpha 1 r^2 + \alpha 2 r^4 + \alpha 3 r^6 + \alpha 4 r^8 + \alpha 5 r^{10} + \alpha 6 r^{12} + \alpha 7 r^{14} + \alpha 8 r^{16}$$

wherein c denotes the vertex curvature where $c=1/R$, R is the vertex radius,
k denotes the conic constant,
$\alpha 1$, $\alpha 2$, $\alpha 4$, $\alpha 5$, $\alpha 6$, 7 and $\alpha 8$ are asphere coefficients,
z is the sagitta and
r is the radial distance from the optical axis of the aspherical lens.

The formula referred to above comprises terms of a polynomial referred to as a correction polynomial in optics. The correction polynomial comprises only terms comprising an even exponent of 2 to 16. The degree of the correction polynomial is thus 16. In the formula above, the correction polynomial does not comprise the terms comprising an odd exponent. An asphere shape defined inter alia by a correction polynomial comprising only terms comprising an even exponent is also referred to as a plane asphere.

One or a plurality of the aspherical lenses may each comprise a shape of a plane asphere.

All the aspherical lenses may each comprise a shape of a plane asphere.

The first surface of the first lens element may face the optoelectronic semiconductor chip.

The second surface of the second lens element may face away from the optoelectronic semiconductor chip.

The aspherical lens of the first surface of the first lens element may be defined by the following formula:

$$z(r) = \frac{cr^2}{1+\sqrt{1-(1+k)c^2r^2}} + \alpha 1 r^2 + \alpha 2 r^4 + \alpha 3 r^6 + \alpha 4 r^8 + \alpha 5 r^{10} + \alpha 6 r^{12} + \alpha 7 r^{14} + \alpha 8 r^{16},$$

wherein z is the sagitta in mm, r is the radial distance from the optical axis of the first lens element, c is the vertex curvature where $c=1/R$, R is the vertex radius where $R=-5.187$ mm+/−10%, k is the conic constant where $k=8.381$+/−10%, $\alpha 1=0.000$+/−0.001, $\alpha 2=-0.005$+/−10%, $\alpha 3=-0.011$+/−10%, $\alpha 4=-0.001$+/−10%, $\alpha 5=0.0001$+/−10%, $\alpha 6=0.0002$+/−10%, $\alpha 7=0.0003$+/−10%, $\alpha 8=-2.092e-005$+/−10%.

The aspherical lens of the second surface of the first lens element is defined by the following formula:

$$z(r) = \frac{cr^2}{1+\sqrt{1-(1+k)c^2r^2}} + \alpha 1 r^2 + \alpha 2 r^4 + \alpha 3 r^6 + \alpha 4 r^8 + \alpha 5 r^{10} + \alpha 6 r^{12} + \alpha 7 r^{14} + \alpha 8 r^{16},$$

wherein z is the sagitta in mm, r is the radial distance from the optical axis of the first lens element, c is the vertex curvature where $c=1/R$, R is the vertex radius where $R=3.426$ mm+/−10%, k is the conic constant where $k=-8.413$+/−10%, $\alpha 1=0.000$+/−0.001, $\alpha 2=-0.124$+/−10%, $\alpha 3=0.013$+/−10%, $\alpha 4=0.010$+/−10%, $\alpha 5=-5.688e-005$+/−10%, $\alpha 6=-0.0002$+/−10%, $\alpha 7=-0.0001$+/−10%, $\alpha 8=1.605e-005$+/−10%.

The aspherical lens of the first surface of the second lens element is defined by the following formula:

$$z(r) = \frac{cr^2}{1+\sqrt{1-(1+k)c^2r^2}} + \alpha 1 r^2 + \alpha 2 r^4 + \alpha 3 r^6 + \alpha 4 r^8 + \alpha 5 r^{10} + \alpha 6 r^{12} + \alpha 7 r^{14} + \alpha 8 r^{16},$$

wherein z is the sagitta in mm, r is the radial distance from the optical axis of the first lens element, c is the vertex curvature where $c=1/R$, R is the vertex radius where $R=-1.316$ mm+/−10%, k is the conic constant, where $k=-0.595$+/−10%, $\alpha 1=0.000$+/−0.001, $\alpha 2=0.028$+/−10%, $\alpha 3=-0.003$+/−10%, $\alpha 4=0.001$+/−10%, $\alpha 5=0.0006$+/−10%, $\alpha 6=9.062e-006$+/−10%, $\alpha 7=2.451e-006$+/−10%, $\alpha 8=-1.130e-005$+/−10%.

The aspherical lens of the second surface of the second lens element is defined by the following formula:

$$z(r) = \frac{cr^2}{1+\sqrt{1-(1+k)c^2r^2}} + \alpha 1 r^2 + \alpha 2 r^4 + \alpha 3 r^6 + \alpha 4 r^8 + \alpha 5 r^{10} + \alpha 6 r^{12} + \alpha 7 r^{14} + \alpha 8 r^{16},$$

wherein z is the sagitta in mm, r is the radial distance from the optical axis of the first lens element, c is the vertex curvature where $c=1/R$, R is the vertex radius where $R=2.923$ mm+/−10%, k is the conic constant where $k=1.617$+/−10%, $\alpha 1=0.000$+/−0.001, $\alpha 2=0.044$+/−10%, $\alpha 3=-0.077$+/−10%, $\alpha 4=-0.009$+/−10%, $\alpha 5=0.006$+/−10%, $\alpha 6=0.003$+/−10%, $\alpha 7=0.0009$+/−10%, $\alpha 8=-0.001$+/−10%.

Providing the above-designated concrete values for R, k and the aspherical coefficients advantageously affords the technical advantage that an efficient imaging of the light emitted by the optoelectronic semiconductor chip may be brought about.

In particular, this affords the technical advantage that a homogeneous illumination of an area may be achieved. That is to say that the originally pixelated light, that is to say the point light sources (=the light-emitting pixels), are imaged such that the imaging area, which may also be referred to as a target region, is illuminated homogeneously and uniformly. The original pixel structure of the semiconductor chip is advantageously thus resolved and disappears as a result of the imaging by the projection optical unit.

Provision is made, in particular, for the target region or the image plane, that is to say the imaging plane, to lie at infinity as viewed mathematically, which is the case physically relative to the conventional semiconductor chip sizes and projection optical units used already at distances to the semiconductor chip starting from 1 m.

In particular, the technical advantage is afforded that a color-homogeneous imaging is achieved. The technical advantage is afforded that a defined illuminance distribution may be set on the area to be illuminated (target area or target region).

Preferably, an illuminance distribution is and/or respectively has been set that comprises in the outermost corners of the area in each case an illuminance of 20% to 40% relative to an illuminance in the center of the area, in particular provided that all the light-emitting pixels are activated, that is to say emit light.

Preferably, an illuminance distribution is and/or respectively has been set that comprises in the outermost corners of the area in each case an illuminance such that an average value over the respective illuminances (in the case of a quadrilateral area, therefore, the average value over the four corners) is 20% to 40% relative to an illuminance in the center of the area, in particular provided that all the light-emitting pixels are activated, that is to say emit light.

In so far as the formulation "x+−10%", wherein x is a numerical value, is used above or below, the percentage indication relates to the x. That is to say therefore that the 10% relate to the preceding value. 100% is thus x. 10% is thus 0.1·x. x stands for a numerical value as indicated above or below for example for R, k, aspherical coefficients, stretching factors and aperture stretching factors.

One or a plurality, preferably all, of the aspherical lenses each comprise a shape that corresponds to a respective stretching of a rotationally symmetrical configuration of the corresponding aspherical lens around the lens centroid of the corresponding aspherical lens by a first stretching factor of 1.1+/−10% in a radial first stretching direction and by a second stretching factor of 0.89+/−10% in a radial second stretching direction extending perpendicularly to the first stretching direction.

This affords the technical advantage, in particular, that a square semiconductor chip may be imaged in rectangular fashion. That is to say that a square may be imaged into a rectangle by such a projection optical unit.

A rotationally symmetrical configuration of an aspherical lens corresponds, for example, to an asphere shape as defined above by one of the formulae referred to above.

That is to say therefore, for example, that such an aspherical lens comprising a stretched shape emerges from an aspherical lens as defined by one of the formulae referred to above by stretching around the lens centroid by the corresponding stretching factors in the two stretching directions referred to above.

An original round lens thus becomes an oval lens.

At least one of the two lens elements, in particular both lens elements may be and/or respectively are each an injection-molded component, in particular an injection-molded component comprising polycarbonate.

This affords the technical advantage, in particular, that the lens element or the lens elements may be produced efficiently. In particular, this advantageously makes it possible to produce a multiplicity of such lens elements efficiently and cost-effectively. Efficient mass production of such a lens element is advantageously made possible as a result.

The semiconductor chip in the formulation projection optical unit that images electromagnetic radiation emitted by an optoelectronic semiconductor chip is the optoelectronic semiconductor chip as described above or below.

The assigned phosphors may be applied on a respective top surface of the semiconductor layer sequences.

This affords the technical advantage, in particular, that an efficient conversion of the electromagnetic radiation generated may be brought about.

The fact that the phosphors are assigned to the pixels means, in particular, that the phosphors are arranged in a main emission direction of the pixels. This affords the technical advantage, for example, that a main proportion of the electromagnetic radiation generated in the active zone is converted. An efficient wavelength conversion is brought about as a result.

The semiconductor chip may be formed as a volume emitter.

The semiconductor chip may be formed as a top emitter.

The semiconductor chip may comprise a carrier, for example, a substrate on which the semiconductor layer sequences are applied.

The substrate may be a growth substrate on which the semiconductor layer sequences are growing.

The carrier may comprise a top side and an underside located opposite the top side.

The semiconductor layer sequences may be applied on the top side.

The carrier may be at least partly transparent, in particular completely transparent to the electromagnetic radiation generated in the respective active zone.

The phosphors may be applied on a side of the carrier facing away from the semiconductor layer sequences. By way of example, the carrier comprises a top side and an underside located opposite the top side. The semiconductor layer sequences are applied, for example, on the top side of the carrier. The phosphors are applied, for example, on the underside of the carrier.

The semiconductor chip may be formed as a thin-film chip.

The carrier may be formed from sapphire. The semiconductor chip may thus be referred to as a sapphire chip.

The semiconductor chip may be formed as a surface emitter, also called a top emitter.

Two phosphors may each comprise a different conversion property, wherein the two phosphors are assigned to the light-emitting pixels in a manner corresponding to a checkered pattern.

This affords the technical advantage, in particular, that a color of the light emitted by the semiconductor chip in total may be set efficiently. In particular, an efficient color-homogeneous illumination of an area may advantageously be brought about as a result.

The phosphors may be assigned to the light-emitting pixels in a manner corresponding to a pattern defined on the basis of the respective conversion properties.

This affords the technical advantage, in particular, that a predetermined spectral distribution of the emitted light may be brought about by providing a corresponding pattern.

The light-emitting pixels may be arranged in a matrix comprising columns and rows, wherein 16, in particular, light-emitting pixels are provided per column and per row.

This affords the technical advantage, in particular, that an efficient homogeneous illumination of an area is made possible on account of this uniform or consistent arrangement.

The light-emitting pixels may be arranged in a matrix comprising columns and rows.

The semiconductor chip may comprise a square shape comprising an edge length of 2.0 mm+/−10%.

This affords the technical advantage, in particular, that the semiconductor chip is constructed compactly and can thus be incorporated efficiently, for example, in terminals, in particular in cellular phones or generally mobile terminals.

The semiconductor chip may comprise a square shape.

One of the conversion properties comprises a wavelength conversion of the electromagnetic radiation generated in the respective active zone into electromagnetic radiation comprising a color temperature of 6000 K+/−800 K such that the correspondingly converted electromagnetic radiation comprises a hue of Cx=0.30 to Cx=0.37 and of Cy=0.29 to Cy=0.37 of the CIE standard colorimetric system, and wherein another of the conversion properties comprises a wavelength conversion of the electromagnetic radiation generated in the respective active zone into electromagnetic radiation comprising a color temperature of 2250 K+/−500 K such that the correspondingly converted electromagnetic radiation comprises a hue of Cx=0.45 to Cx=0.55 and of Cy=0.40 to Cy=0.48 of the CIE standard colorimetric system.

This affords the technical advantage, in particular, that by corresponding driving of the individual pixels, the electromagnetic color converted in total comprises an adjustable hue lying between a cold-white color, that is to say a color temperature of 6000 kelvins+−800 kelvins, and a warm-white color, that is to say a color temperature of 2250 kelvins+−500 kelvins. A correspondingly constructed illumination system may thus advantageously illuminate an area with an illumination light which comprises a color temperature in the range referred to above.

The mobile terminal may be a cellular phone, for example.

An aperture stop may be arranged in the beam path of the light imaged by the projection optical unit. That is to say therefore, in particular, that the electromagnetic radiation emitted by the semiconductor chip is only imaged by the projection optical unit before it impinges on the aperture stop.

The aperture stop may comprise a circular aperture. A diameter of the circular aperture is, for example, 2.1 mm+/−10%.

The aperture stop may comprise an oval aperture.

The second surface of the second lens element may face the aperture stop.

The first surface of the first lens element may face away from the aperture stop.

The aperture stop may be comprised of the projection optical unit.

The aperture stop may comprise an aperture, wherein the aperture comprises a shape corresponding to a respective stretching of a circular aperture around a center point of the circular aperture by a first aperture stretching factor of 1.1+/−10% in a radial first stretching direction and by a second aperture stretching factor of 0.89+/−10% in a radial second aperture stretching direction extending perpendicularly to the first aperture stretching direction.

A phosphor denotes, in particular, a phosphor combination.

A phosphor is, for example, $Y_3(Al_{1-x}Ga_x)_5O_{12}$:Ce. A Ce proportion is, for example, 0.5 mol % to 5 mol %, for example, 0.5 mol % to 2.5 mol %, in each case relative to the rare earth metals and a gallium proportion x of 0 to 0.5.

A phosphor is, for example:
$(Gd,Lu,Tb,Y)_3(Al,Ga,D)_5(O,X)_{12}$:RE, where X=halide or a divalent element, D=trivalent or tetravalent element, and RE=rare earth metals as activator, in particular Ce with, for example, an optional Co dopant.

The phosphor is, for example:
$Y_3(Al_{1-x}Ga_x)_5O_{12}$:Ce. A Ce proportion is, for example, 0.5 mol % to 5 mol %, for example, 0.5 mol % to 3 mol %, in each case relative to the rare earth metals and a gallium proportion x of 0 to 0.5.

The phosphor may be, for example:
$Sr(Sr_aCa_{1-a})Si_2Al_2N_6$:RE, with 0 to 1, for example, 0.5 to 1, and RE=rare earth metals as activator, in particular Eu with, for example, an optional Co dopant.

A phosphor is a combination of a plurality of the phosphors referred to above.

A distance between the semiconductor chip and the first surface of the first lens element may be 0.173 mm+/−10%.

A thickness of the first lens element may be 1.034 mm+/−10%.

A distance between the second surface of the first lens element and the first surface of the second lens element (that is to say the distance between the two lens elements) may be 0.073 mm+/−10%.

A thickness of the second lens element may be 2.460 mm+/−10%.

A distance between the second surface of the second lens element and the aperture stop may be 0.198 mm+/−10%.

The light-emitting pixels may emit electromagnetic radiation in the range of 440 nm to 470 nm.

The light-emitting pixels may be formed as surface emitters. In this respect, the semiconductor chip is formed in particular as a surface emitter.

If sapphire is used as carrier for the light-emitting pixels, I provide for side surfaces of the carrier to be covered in a light-nontransmissive fashion.

The aim is a semiconductor chip that appears substantially white to the human eye.

In so far as the formulation "light" is used above or below, the formulation "electromagnetic radiation" is intended to be concomitantly inferred, and vice versa.

The projection optical unit may comprise as lens elements exclusively the first lens element and the second lens element. That is to say therefore, in particular, that the projection optical unit preferably comprises exactly two lens elements: the first lens element and the second lens element. The projection optical unit thus preferably does not comprise a third lens element.

Both lens elements may be non-rotationally symmetrical.

The two lens elements may be formed from the same material. That is to say therefore, in particular, that the refractive indices of the two lens elements are identical.

The first lens element may be formed as a singlet lens. The first lens element is thus preferably formed from a single lens.

The second lens element may be formed as a singlet lens. The second lens element is thus preferably formed from a single lens.

An aperture may be provided, which may hereinafter also be referred to as an aperture stop.

The aperture may be arranged opposite the first light-refracting surface of the first lens element. The aperture is therefore preferably not arranged between the two lens elements.

The aperture may be arranged opposite the second light-refracting surface of the second lens element. The aperture is therefore preferably not arranged between the two lens elements.

The aperture may be arranged upstream of one of the lens elements at the output of the projection optical unit. The aperture is therefore preferably not arranged between the two lens elements.

The first lens element may be free of a plane face. The first lens element is therefore preferably different than a plano-convex lens.

The second lens element may be free of a plane face. The second lens element is therefore preferably different than a planoconvex lens.

The projection optical unit may be configured to image a square into a rectangle. That is to say therefore, for example, that a square semiconductor chip is imaged into a rectangular semiconductor chip.

The projection optical unit may be configured to image the semiconductor chip unsharply.

The projection optical unit may be configured to carry out non-aplanatic imaging.

A side length of the semiconductor chip is designated hereinafter, for example, by Dc.

A distance between the semiconductor chip and the second surface of the second lens element may also be designated as a height of the projection optical unit. The distance is designated hereinafter by Dz.

A width of the second lens element is designated hereinafter, for example, by DL.

According to several examples:
1 mm<Dc<4 mm or
Dc=2 mm or
1.4*Dc<Dz<2.4*Dc or
1.4*Dc<DL<2.0*Dc.

The above-described properties, features and advantages and the way in which they are achieved will become clearer and more clearly understood in association with the following description of the examples which are explained in greater detail in association with the drawings.

Identical reference signs may be used hereinafter for identical features.

Furthermore, not every drawing depicts all of the reference signs, for the sake of clarity.

In accordance with the schematic sectional illustration in FIG. 1, one example of a first optoelectronic semiconductor chip 1 is explained in greater detail. The optoelectronic semiconductor chip 1 comprises a semiconductor layer sequence 11, 12, 13 comprising an n-conducting semiconductor layer 11, an active zone 13 and a p-conducting semiconductor layer 12.

Furthermore, the optoelectronic semiconductor chip 1 comprises an n-type contacting layer 21, which is in direct contact with the n-conducting semiconductor layer 11 and is formed in electrically conducting fashion, and also a p-type contacting layer 22, which directly adjoins the p-conducting semiconductor layer 12 and is likewise formed in electrically conducting fashion. The optoelectronic semiconductor chip 1 additionally comprises a first isolation layer 31, a second isolation layer 32, a third isolation layer 33 and a fourth isolation layer 34. The third isolation layer 33 is arranged between the p-conducting semiconductor layer 12 and the n-type contacting layer 21 and extends transversely with respect to the main extension plane of the optoelectronic semiconductor chip 1. The third isolation layer 33 directly adjoins all the side surfaces of the n-type contacting layer 21 and the p-conducting semiconductor layer 12. The third isolation layer 33 may electrically and/or optically isolate the p-conducting semiconductor layer 12 from the n-type contacting layer 21.

What is brought about by the third isolation layer 33 is, in particular, that regions of the active zone 13 and of the p-conducting semiconductor layer 12 are formed which are electrically isolated from one another such that the regions form light-emitting pixels 71, 72. The pixels 71, 72 thus each comprise a semiconductor layer sequence 11, 12, 13 comprising an active zone 13.

Pixels may also be referred to as image points.

The pixels 71, 72 are separated from one another by a trench 111. It is possible, in particular, for the n-type contacting layer 21 to be formed in reflective fashion and/or the third isolation layer 33 to be formed in radiation-nontransmissive fashion such that the pixels 71, 72 are optically isolated from one another. Furthermore, the trench 111 enables an optimum electrical and/or optical isolation of the pixels 71, 72.

The width of the n-type contacting layer 21, that is to say the extent thereof along an imaginary connecting line between the mid-points of two adjacent pixels 71, 72, may in this case be, for example, at least 2 μm to at most 10 μm. Furthermore, the lateral distance between two adjacent pixels 71, 72 along an imaginary connecting line between the mid-points of these adjacent pixels 71, 72 may be, for example, at least 5 μm to at most 20 μm.

The second 32 and the third isolation layer 33 each extend transversely with respect to the main extension plane of the semiconductor layer sequence 11, 12, 13. In other words, the second and the third isolation layer 32, 33 are each arranged at the sidewalls 70 of the pixels 71, 72.

Furthermore, the optoelectronic semiconductor chip 1 comprises a metallization layer 23 arranged on the second 32 and third isolation layer 33. The metallization layer 23 is not electrically connected to the semiconductor layer sequence 11, 12, 13, the n-type contacting layer 21 and/or the p-type contacting layer 22.

The optoelectronic semiconductor chip 1 may additionally comprise a growth carrier 7. The growth carrier 7 may be formed, for example, with sapphire or some other material suitable for the growth of semiconductor layer sequences 11, 12, 13. It is also possible, however, for the optoelectronic semiconductor chip 1 not to comprise a carrier 7. Preferably, the growth carrier 7 is formed from a material configured as radiation-transmissive to the electromagnetic radiation emitted by the active zone 13. Preferably, the optoelectronic semiconductor chip 1 then emits in the direction of the growth carrier 7.

The growth carrier 7, which may generally be a carrier, for example, comprises a top side 7a and an underside 7c located opposite the top side, which underside may also be referred to as a bottom side. The semiconductor layer sequence 11, 12, 13 is applied on the top side 7a with the n-conducting semiconductor layer 11 as first semiconductor layer.

The optoelectronic semiconductor chip 1 comprises two differently formed phosphors 80, 81. That is to say that the two phosphors 80, 81 each comprise a different conversion property. By way of example, a color temperature of the respective light converted by the phosphors 80, 81 is different.

The phosphor 80 may be applied on a top surface 22a of the p-type contacting layer 22 of the pixel 72.

The phosphor 81 may be applied on a top surface 22a of the p-type contacting layer 22 of the pixel 71.

The phosphor 80, 81 may be applied as a phosphor layer on the corresponding top surface 22a.

That is to say therefore that, for example, the phosphor 81 is assigned to the pixel 71. The phosphor 80 is assigned to the pixel 72.

The two phosphors 80, 81 are applied, for example, on the bottom side 7c of the growth carrier 7. In this case, the two phosphors 80, 81 are applied on the bottom side or underside 7c of the growth carrier 7 such that they respectively face and are arranged opposite the pixels 71, 72. This example is particularly expedient if the growth carrier 7 is at least partly radiation-transmissive to the electromagnetic radiation generated.

FIG. 1 depicts both possibilities (application on the top layer 22a and on the underside 7c), wherein it is clear to those skilled in the art that depending on the direction in which a principal emission direction or main emission direction of the electromagnetic radiation generated in the respective active zone 13 points, the phosphor 80, 81 is then also provided in this direction.

By corresponding driving of the two pixels 71, 72, electromagnetic radiation may thus be generated in the respective active zone 13. This electromagnetic radiation 13 generated is converted by the phosphors 80, 81. The corresponding electromagnetic radiation is referred to as converted electromagnetic radiation.

Since the conversion properties of the phosphors 80, 81 are different, the corresponding converted electromagnetic radiation will thus also differ from one another. In this regard, by way of example, the electromagnetic radiation converted by the phosphor 80 may comprise a color temperature of 6000 K+−800 K such that the converted electromagnetic radiation comprises a hue of Cx=0.30 to Cx=0.37 and Cy=0.29 to Cy=0.37 of the CIE standard colorimetric system.

By way of example, provision is made for the electromagnetic radiation converted by the phosphor 81 to comprise a color temperature of 2250 K+−500 K such that the converted electromagnetic radiation comprises a color temperature of Cx=0.45 to Cx=0.55 and Cy=0.40 to Cy=0.48 of the CIE standard colorimetric system.

In total, a color mixing of the respective converted electromagnetic radiation will then occur depending, in particular, on how the respective intensities of the converted electromagnetic radiations are manifested.

The converted electromagnetic radiation may be imaged by a projection optical unit as described above or below.

The illustration chosen in FIG. 1 shows just two pixels 71, 72. The semiconductor chip 1 may comprise more than two pixels. By way of example, the pixels are arranged in a matrix formed from columns and rows. By way of example 16, in particular 8, light-emitting pixels are provided per column and per row.

Figure 2:
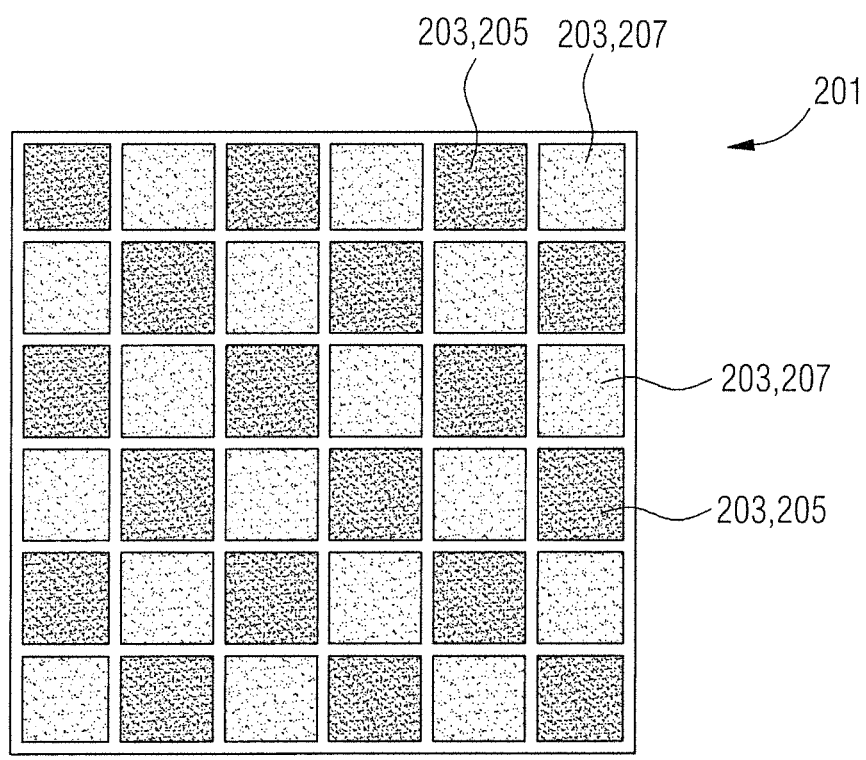
FIG. 2 shows a second optoelectronic semiconductor chip.

FIG. 2 shows a second optoelectronic semiconductor chip 201 in a plan view.

The second semiconductor chip 201 is illustrated in a more simplified and more schematic manner compared to the first semiconductor chip in FIG. 1. An explicit illustration of the semiconductor layer sequences and of the active zones such as also shown in detail in FIG. 1, has been dispensed with for the sake of clarity.

The second optoelectronic semiconductor chip 201 comprises a plurality of individually drivable light-emitting pixels 203. The plurality of light-emitting pixels are arranged in a matrix, wherein the matrix is formed from rows and columns. The matrix comprises 6·6 light-emitting pixels. That is to say that six light-emitting pixels are provided per row and per column.

The pixels 203 are respectively assigned a phosphor, wherein two differently formed phosphors are used for the optoelectronic semiconductor chip 201. That is to say that the optoelectronic semiconductor chip 201 comprises a first phosphor and a second phosphor that each comprise a different conversion property.

Figure 3:
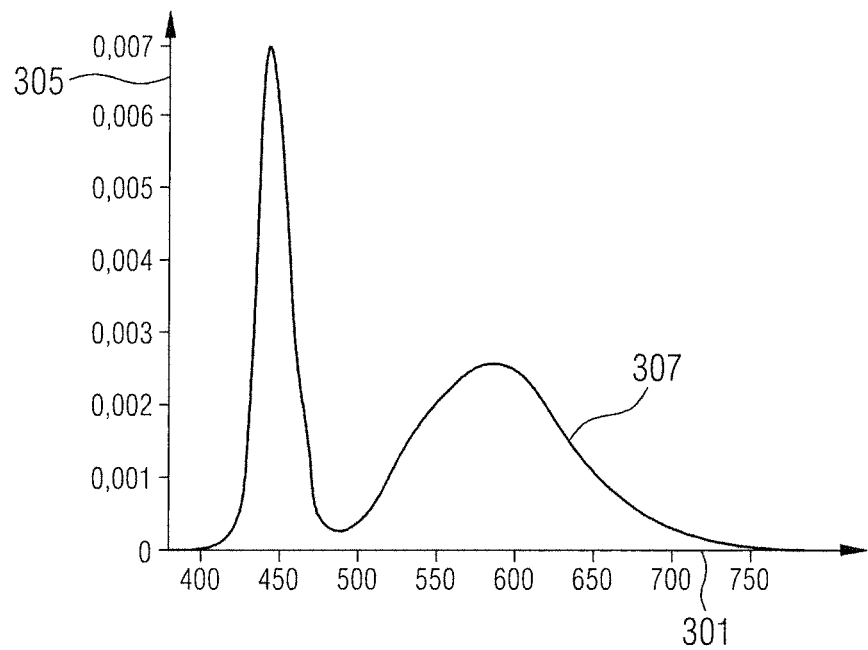
FIG. 3 shows a spectral distribution of electromagnetic radiation converted by a first phosphor.

The first phosphor converts electromagnetic radiation emitted by the active zone of a light-emitting pixel into electromagnetic radiation that comprises a spectral distribution as shown in FIG. 3.

Figure 4:
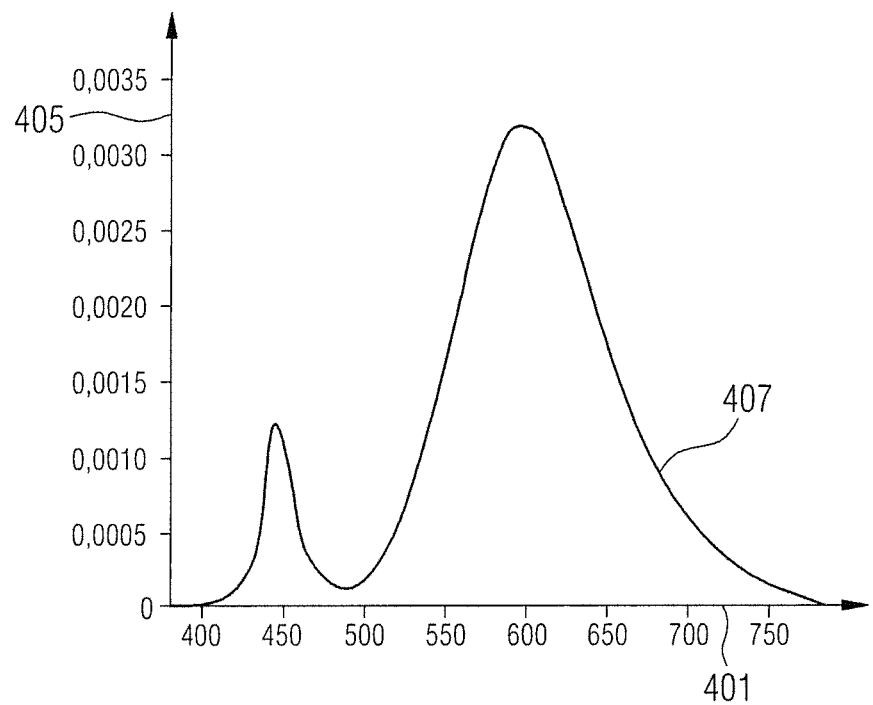
FIG. 4 shows a spectral distribution of electromagnetic radiation converted by a second phosphor.

The second phosphor converts the electromagnetic radiation that is generated by the active zone of a light-emitting pixel into electromagnetic radiation comprising a spectral distribution as shown in FIG. 4.

The first phosphor is, for example: $Y_3(Al_{1-x}Ga_x)_5O_{12}$:Ce. A Ce proportion is, for example, 0.5 mol % to 5 mol %, for example, 0.5 mol % to 2.5 mol %, in each case relative to the rare earth metals and a gallium proportion x of 0 to 0.5.

The first phosphor may be, for example: $(Gd,Lu,Tb,Y)_3(Al,Ga,D)_5(O,X)_{12}$:RE, where X=halide or a divalent element, D=trivalent or tetravalent element, and RE=rare earth metals as activator, in particular Ce with, for example, an optional Co dopant.

On account of the spectral distribution, the first phosphor may also be referred to as a cold-white phosphor.

The second phosphor is, for example: $Y_3(Al_{1-x}Ga_x)_5O_{12}$:Ce. A Ce proportion is, for example, 0.5 mol % to 5 mol %, for example, 0.5 mol % to 3 mol %, in each case relative to the rare earth metals and a gallium proportion x of 0 to 0.5

The second phosphor is, for example: $Sr(Sr_aCa_{1-a})Si_2Al_2N_6$:RE, with 0 to 1, for example, 0.5 to 1, and RE=rare earth metals as activator, in particular Eu with, for example, an optional Co dopant.

The second phosphor is, for example: $(Gd,Lu,Tb,Y)_3(Al,Ga,D)_5(O,X)_{12}$:RE, where X=halide or a divalent element, D=trivalent or tetravalent element, and RE=rare earth metals as activator, in particular Ce with, for example, an optional Co dopant.

On account of the spectral distribution, the second phosphor may also be referred to as a warm-white phosphor.

The two phosphors are assigned to the light-emitting pixels 203 in a manner corresponding to a checkered pattern.

This is illustrated as follows: a pixel 203 to which the first phosphor is assigned is additionally also designated by the reference sign 205.

A light-emitting pixel 203 to which the second phosphor is assigned is additionally also designated by the reference sign 207.

In order that the different color of the converted electromagnetic radiation is illustrated, different hatchings have been used.

Since the light-emitting pixels 203 are individually drivable, this advantageously makes it possible, for example, to switch on exclusively the light-emitting pixels 205 or exclusively the light-emitting pixels 207. Correspondingly, as a result the optoelectronic semiconductor chip 201 may advantageously emit light comprising two different color temperatures.

Depending on a number of activated light-emitting pixels 207 and a number of activated light-emitting pixels 205, a specific color temperature of the light emitted by the semiconductor chip 201 may advantageously be set, for example, wherein The color temperature lies between the two color temperatures of the respective converted light correspondingly with exclusive activation of the light-emitting pixels 205 and with exclusive activation of the light-emitting pixels 207.

FIG. 3 shows a spectral distribution of an electromagnetic radiation converted by the first phosphor referred to above.

The reference sign 301 points to the abscissa. The reference sign 305 points to the ordinate. The intensity in arbitrary units is plotted against the wavelengths in nanometers.

The spectral profile is identified by the reference sign 307.

FIG. 4 shows a spectral distribution of an electromagnetic radiation converted by the second phosphor referred to above.

The reference sign 401 points to the abscissa. The reference sign 405 points to the ordinate. The intensity in arbitrary units is plotted against the wavelength in nanometers. The spectral profile is identified by the reference sign 407.

It is evident that the two spectral profiles 307, 407 differ from one another. By way of example, a global maximum of the spectral distribution 307 is at approximately 450 nm. By way of example, a global maximum of the spectral distribution 407 is at approximately 600 nm. This is caused in particular by the different conversion properties of the two phosphors.

Figure 5:
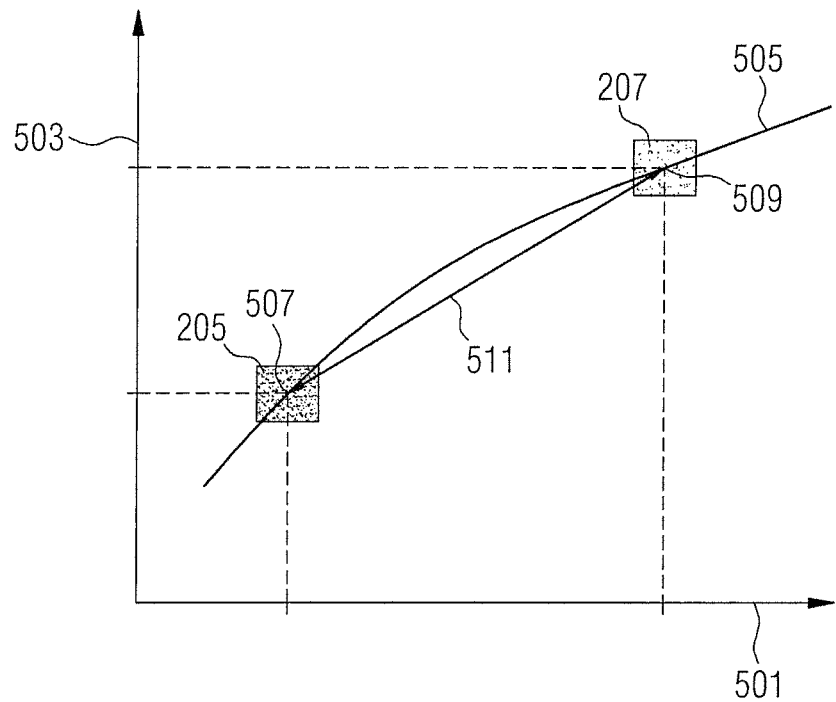
FIG. 5 shows a respective color locus of the spectral distributions shown in FIGS. 3 and 4 relative to the CIE standard colorimetric system.

FIG. 5 shows a graphical illustration of the CIE standard colorimetric system, which may also be referred to as the CIE standard chromaticity system.

The reference sign 501 points to the Cx-axis of the CIE standard colorimetric system. The reference sign 503 points to the Cy-axis of the CIE standard colorimetric system.

The reference system 505 points to the Planckian locus in the CIE standard colorimetric system.

A first point 507 on the Planckian locus 505 corresponds to a color temperature in the CIE standard colorimetric system of an electromagnetic radiation comprising the spectral distribution 307, as shown in FIG. 3.

A second point 509 on the Planckian locus 505 corresponds to a color temperature in the CIE standard colorimetric system of an electromagnetic radiation comprising the spectral distribution 407 as shown in FIG. 4.

The two points 507, 509 may, but need not, lie exactly on the Planckian locus 505. By way of example, a deviation of 10% from the Planckian locus 505 is also permissible. A respective spectral distribution 307, 407 is thus provided, for example, the color locus of which is 10% around the Planckian locus 505.

The reference sign 511 points to a mixing straight line on which lie those color loci of the electromagnetic radiation emitted by means of the semiconductor chip 201 (and thus converted) which may be set by corresponding driving of the two light-emitting pixels 205, 207.

That is to say therefore the optoelectronic semiconductor chip 201, given corresponding driving of the light-emitting pixels 205, 207 may emit light which comprises a color locus lying on the mixing straight line 511.

Figure 6:
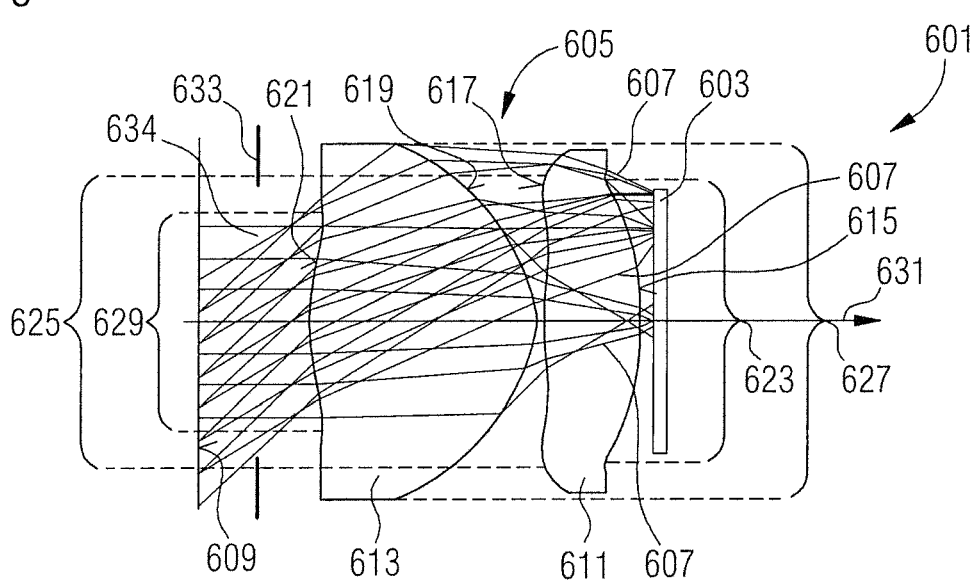
FIG. 6 shows an optoelectronic illumination system.

FIG. 6 shows a lateral sectional view of an optoelectronic illumination system 601 illustrated in a simplified manner.

The illumination system 601 comprises an optoelectronic semiconductor chip 603, which is square, for example. For the sake of clarity, the optoelectronic semiconductor chip 603 is illustrated in a very simplified manner in the form of a thick line. The further elements of the semiconductor chip 603 are not illustrated, for the sake of clarity. Nevertheless, the semiconductor chip 603 is an optoelectronic semiconductor chip as described above or below. By way of example, the semiconductor chip 603 is formed analogously to the semiconductor chip 1 or to the semiconductor chip 201.

The optoelectronic illumination system 601 comprises a projection optical unit 605 that images electromagnetic radiation emitted by an optoelectronic semiconductor chip.

The projection optical unit 605 is therefore configured to image the electromagnetic radiation emitted by the semiconductor chip 603. The projection optical unit 605 images the electromagnetic radiation onto an area 609. A beam path of the electromagnetic radiation emitted by the semiconductor chip 603 through the projection optical unit 605 onto the area 609 is symbolically illustrated by means of a plurality of light rays 607.

The projection optical unit 605 comprises a first lens element 611 and a second lens element 613. The two lens elements 611, 613 are arranged at a distance from one another. The distance is, for example, 0.073 mm+/−10%.

The first lens element 611 comprises a first light-refracting surface 615. The first lens element 611 comprises a second light-refracting surface 617. The first surface 615 is located opposite the second surface 617. The first surface 615 thus faces the second surface 617, and vice versa.

The second lens element 613 comprises a light-refracting surface 619 and a second light-refracting surface 621. The two light-refracting surfaces 619, 621 are located opposite one another and face one another.

The second surface 617 of the first lens element 611 faces the first surface 619 of the second lens element 613.

The first light-refracting surface 615 of the first lens element 611 comprises an asphere-shaped surface section 623, which forms an aspherical lens. The aspherical lens is hereinafter likewise designated by the reference sign 623.

The second light-refracting surface 617 of the first lens element 611 comprises an asphere-shaped surface section 625, wherein the surface section 625 forms an aspherical lens. The aspherical lens is hereinafter likewise designated by the reference sign 625.

The first light-refracting surface 619 of the second lens element 613 comprises an asphere-shaped surface section 627. The asphere-shaped surface section 627 forms an aspherical lens. The aspherical lens is hereinafter likewise designated by the reference sign 627.

The second light-refracting surface 621 of the second lens element 613 comprises an asphere-shaped surface section 629. The asphere-shaped surface section 629 forms an aspherical lens. The aspherical lens is hereinafter likewise designated by the reference sign 629.

The respective optical axes of the two lens elements 611, 613 are arranged colinearly with respect to one another and thus lie along a common axis. This common optical axis is designated by the reference sign 631.

Electromagnetic radiation emitted by the semiconductor chip 603 will thus first radiate through the first lens element 611, then through the second lens element 613, and then be correspondingly imaged onto the area 609. That is to say that the electromagnetic radiation emitted by the semiconductor chip 603 is imaged onto the area 609 by the four aspherical lenses 623, 625, 627, 629.

An aperture stop 633 is provided between the area 609 and the second surface 621 of the second lens element 613. A distance between the aperture stop 633 and the second light-refracting surface 621 of the second lens element 613 is, for example, 0.198 mm+/−10%.

An aperture 634 of the aperture stop 633 is circular or oval, for example. A circular aperture stop 633 comprises, for example, a diameter of 2.1 mm+/−10%.

The aspherical lens 623 of the first light-refracting surface 615 of the first lens element 611 may be defined by the following formula:

$$z(r) = \frac{cr^2}{1+\sqrt{1-(1+k)c^2r^2}} + \alpha 1 r^2 + \alpha 2 r^4 + \alpha 3 r^6 + \alpha 4 r^8 + \alpha 5 r^{10} + \alpha 6 r^{12} + \alpha 7 r^{14} + \alpha 8 r^{16},$$

wherein z is the sagitta in mm, r is the radial distance from the optical axis of the first lens element, c is the vertex curvature where c=1/R, R is the vertex radius where R=−5.187 mm+/−10%, k is the conic constant where k=8.381+/−10%, α1=0.000+/−0.001, α2=−0.005+/−10%, α3=−0.011+/−10%, α4=−0.001+/−10%, α5=0.0001+/−10%, α6=0.0002+/−10%, α7=0.0003+/−10%, α8=−2.092e-005+/−10%.

The aspherical lens 625 of the second light-refracting surface 617 of the first lens element 611 may be defined by the following formula:

$$z(r) = \frac{cr^2}{1+\sqrt{1-(1+k)c^2r^2}} + \alpha 1 r^2 + \alpha 2 r^4 + \alpha 3 r^6 + \alpha 4 r^8 + \alpha 5 r^{10} + \alpha 6 r^{12} + \alpha 7 r^{14} + \alpha 8 r^{16},$$

wherein z is the sagitta in mm, r is the radial distance from the optical axis of the first lens element, c is the vertex curvature where c=1/R, R is the vertex radius where R=3.426 mm+/−10%, k is the conic constant where k=−8.413+/−10%, α1=0.000+/−0.001, α2=−0.124+/−10%, α3=0.013+/−10%, α4=0.010+/−10%, α5=−5.688e-005+/−10%, α6=−0.0002+/−10%, α7=−0.0001+/−10%, α8=1.605e-005+/−10%.

The aspherical lens 627 of the first light-refracting surface 619 of the second lens element 613 may be defined by the following formula:

$$z(r) = \frac{cr^2}{1+\sqrt{1-(1+k)c^2r^2}} + \alpha 1 r^2 + \alpha 2 r^4 + \alpha 3 r^6 + \alpha 4 r^8 + \alpha 5 r^{10} + \alpha 6 r^{12} + \alpha 7 r^{14} + \alpha 8 r^{16},$$

wherein z is the sagitta in mm, r is the radial distance from the optical axis of the first lens element, c is the vertex curvature where c=1/R, R is the vertex radius where R=−1.316 mm+/−10%, k is the conic constant, where k=−0.595+/−10%, α1=0.000+/−0.001, α2=0.028+/−10%, α3=−0.003+/−10%, α4=0.001+/−10%, α5=0.0006+/−10%, α6=9.062e-006+/−10%, α7=2.451e-006+/−10%, α8=−1.130e-005+/−10%.

The aspherical lens 629 of the second light-refracting surface 621 of the second lens element 613 may be defined by the following formula:

$$z(r) = \frac{cr^2}{1+\sqrt{1-(1+k)c^2r^2}} + \alpha 1 r^2 + \alpha 2 r^4 + \alpha 3 r^6 + \alpha 4 r^8 + \alpha 5 r^{10} + \alpha 6 r^{12} + \alpha 7 r^{14} + \alpha 8 r^{16},$$

wherein z is the sagitta in mm, r is the radial distance from the optical axis of the first lens element, c is the vertex curvature where c=1/R, R is the vertex radius where R=2.923 mm+/−10%, k is the conic constant where k=1.617+/−10%, α1=0.000+/−0.001, α2=0.044+/−10%, α3=−0.077+/−10%, α4=−0.009+/−10%, α5=0.006+/−10%, α6=0.003+/−10%, α7=0.0009+/−10%, α8=−0.001+/−10%.

The first lens element 611 may be an injection-molded component, in particular an injection-molded component comprising polycarbonate.

The second lens element 613 may be an injection-molded component, in particular an injection-molded component comprising polycarbonate.

Providing a projection optical unit 605 as described above affords the technical advantage, for example, that the light emitted by the semiconductor chip 603 may be imaged efficiently onto the area 609. The area 609 may thus advantageously be illuminated efficiently. In particular, this advantageously makes it possible for the area 609 to be illuminated homogeneously and in particular color-homogeneously.

The area 609 should be understood, for example, as a placeholder for a scene to be illuminated. A scene is, for example, an arrangement of one or a plurality of objects and one or a plurality of persons. Under unfavorable lighting conditions, it is expedient, for example, to illuminate such a scene to be able to record a sufficiently illuminated image of the scene by a camera. By providing an optoelectronic illumination system 601 as described above, such a scene may be illuminated efficiently. In particular, a color temperature of the illumination light may be set efficiently. This is on account of the provision of a semiconductor chip comprising differently formed phosphors, as described above or below. By setting a specific color temperature of the illumination light, that is to say the electromagnetic radiation imaged onto the area 609, by way of example it is advantageously possible to avoid a color cast in the recorded image. By way of example, by setting a specific color temperature, a face in an image recorded under the corresponding illumination light may comprise a natural hue for the human observer.

Therefore, in the real application, the area 609 is generally significantly further away from the illumination system 601 than is illustrated in FIG. 6.

In particular, the technical advantage is afforded that a color-homogeneous imaging is achieved. In particular, the technical advantage is afforded that a defined illuminance distribution may be set on the area 609 to be illuminated (target area or target region).

Preferably, an illuminance distribution is and/or respectively has been set that comprises in the outermost corners of the area 609 in each case an illuminance of 20% to 40% relative to an illuminance in the center of the area 609, in particular provided that all the light-emitting pixels are activated, that is to say emit light.

Preferably, an illuminance distribution is and/or respectively has been set that comprises in the outermost corners of the area 609 in each case an illuminance such that an average value over the respective illuminances (in the case of a quadrilateral area, therefore, the average value over the four corners) is 20% to 40% relative to an illuminance in the center of the area 609, in particular provided that all the light-emitting pixels are activated, that is to say emit light.

The elements described and shown in FIG. 6 are also each individually disclosed by themselves.

Figure 7:
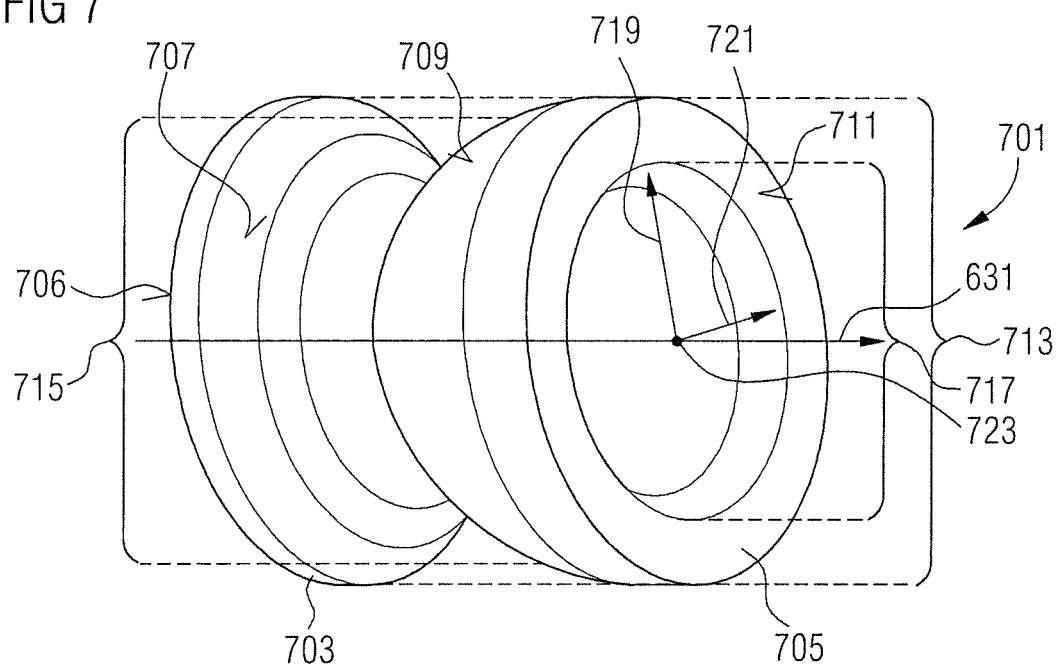
FIG. 7 shows a projection optical unit.

FIG. 7 shows a second projection optical unit 701 that images electromagnetic radiation emitted by an optoelectronic semiconductor chip.

The projection optical unit 701 comprises a first lens element 703 and a second lens element 705 arranged at a distance from one another. In the illustration of the projection optical unit 701 as shown in FIG. 7, although the impression may arise that the two lens elements 703, 705 are formed as a common component, nevertheless it is explicitly pointed out that the two lens elements 703, 705 are components formed as physically separated from one another.

The first lens element 703 comprises a first light-refracting surface 706. The first lens element 703 comprises a second light-refracting surface 707 located opposite the first light-refracting surface 706.

The second lens element 705 comprises a first light-refracting surface 709. The second lens element 705 comprises a second light-refracting surface 711 located opposite the first light-refracting surface 709.

The two lens elements 703, 705 are arranged such that the second light-refracting surface 707 of the first lens element 703 faces the first light-refracting surface 709 of the second lens element 705.

The four light-refracting surfaces 706, 707, 709 and 711 each comprise an asphere-shaped surface section such that the respective surface section forms an aspherical lens.

On account of the illustration of the projection optical unit 701 as chosen in FIG. 7, the aspherical lens of the first light-refracting surface 706 of the first lens element 703 is not visible.

The aspherical lens of the second light-refracting surface 707 of the first lens element 703 is identified by the reference sign 713.

The aspherical lens of the first light-refracting surface 709 of the second lens element 705 is identified by the reference sign 715.

The aspherical lens of the second light-refracting surface 711 of the second lens element 705 is identified by the reference sign 717.

The aspherical lens of the first light-refracting surface 706 comprises a shape that emerges from the asphere shape of the aspherical lens 623 of the first light-refracting surface 615 of the first lens element 611 of the projection optical unit 605 by a stretching around the lens centroid (not illustrated for pictorial reasons) of the first lens element 611 by a stretching factor of 1.1+−10% in a first radial stretching direction and by a stretching of 0.89+−10% in a radial second stretching direction extending perpendicularly to the first stretching direction.

The aspherical lens 713 of the second light-refracting surface 707 of the first lens element 703 emerges analogously from the asphere shape of the aspherical lens 625 of the second light-refracting surface 617 of the first lens element 611 of the projection optical unit 605 by the stretching with the same stretching factors as described above in association with the aspherical lens of the first light-refracting surface 706 of the first lens element 703.

The aspherical lens 715 of the first light-refracting surface 709 of the second lens element 705 emerges analogously from the asphere shape of the aspherical lens 627 of the first light-refracting surface 619 of the second lens element 613 of the projection optical unit 605 by the stretching with the same stretching factors as described in association with the aspherical lens of the first light-refracting surface 706 and/or respectively the aspherical lens 713 of the second light-refracting surface 707 of the first lens element 703.

A shape of the aspherical lens 717 of the second light-refracting surface 711 of the second lens element 705 emerges analogously from the asphere shape of the aspherical lens 629 of the second light-refracting surface 621 of the second lens element 613 of the projection optical unit 605 by the previously designated stretching with the same stretching factors.

For illustration purposes, a lens centroid 723 of the second lens 717 of the second light-refracting surface 711 of the second lens element 705, a first radial stretching direction 719 and a radial second stretching direction 721 extending perpendicularly to the first stretching direction 719 are depicted by way of example for the aspherical lens 717.

The two lens elements 703, 705 are arranged colinearly in terms of their respective optical axes analogously to the lenses 611, 613 of the projection optical unit 605, that is to say that they have a common optical axis 631.

The second projection optical unit 701 may comprise an aperture stop (not shown). The aperture stop faces the second surface 621 of the second lens element 613, for example, analogously to the first projection optical unit 605. The aperture stop is arranged, for example, in the beam path of the light imaged by the second projection optical unit 701.

The aperture stop of the second projection optical unit 701 is stretched analogously to the above-described stretching by the corresponding stretching factors. An originally circular aperture thus becomes an oval aperture.

That is to say therefore that, a projection optical unit is provided that comprises oval aspherical lenses that emerge from the rotationally symmetrical aspherical lenses described in association with the projection optical unit 605 by the corresponding stretching referred to above.

A value for the first stretching factor in the first stretching direction 719 may be 1.1+−10%.

A value for the second stretching factor in the second stretching direction 721 may be 0.89+−10%.

Figure 8:
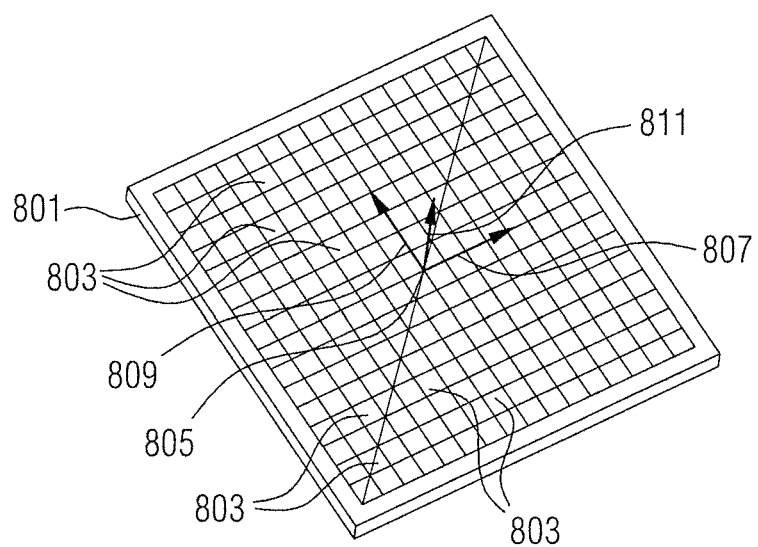
FIG. 8 shows a first operating state of a third optoelectronic semiconductor chip.

FIG. 8 shows a first operating state of a third optoelectronic semiconductor chip 801 in a plan view.

The optoelectronic semiconductor chip 801 illustrated in a simplified manner comprises a square shape and a plurality of individual drivable light-emitting pixels. The individually drivable light-emitting pixels 803 are arranged in a matrix formed by 16 columns and 16 rows. That is to say that in each case 16 light-emitting pixels 803 are provided per column and per row.

The pixels 803 are respectively assigned a phosphor, wherein the assigned phosphors each comprise at least in part a different conversion property.

A coordinate system 805 is depicted for orientation purposes. The coordinate system 805 is an x-y-z-coordinate system. The reference sign 807 points to the x-axis. The reference sign 809 points to the y-axis. The reference sign 811 points to the z-axis.

The chip 801 lies in the x-y-plane.

Furthermore, connecting lines between the mid-points of the opposite edges of the square semiconductor chip 801 are depicted in the drawings in FIGS. 8 to 13. This is merely for pictorial reasons to directly identify the mid-point of the semiconductor chip 801. These lines are not present in reality.

In the first operating state of the semiconductor chip 801, all 16·16 light-emitting pixels 803 are activated, that is to say are luminous.

Figure 9:
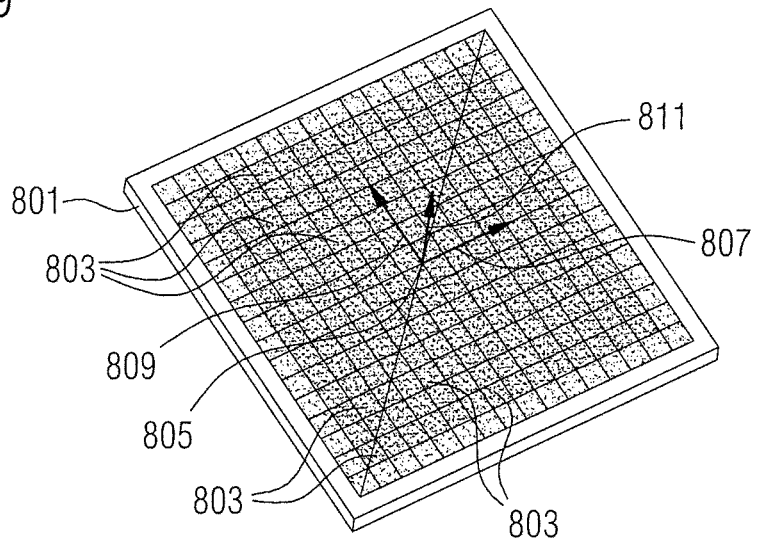
FIG. 9 shows an intensity distribution of the electromagnetic radiation emitted by means of the third optoelectronic semiconductor chip operated in the first operating state.

FIG. 9 shows the intensity distribution of the emitted light that corresponds to said first operating state.

Figure 10:
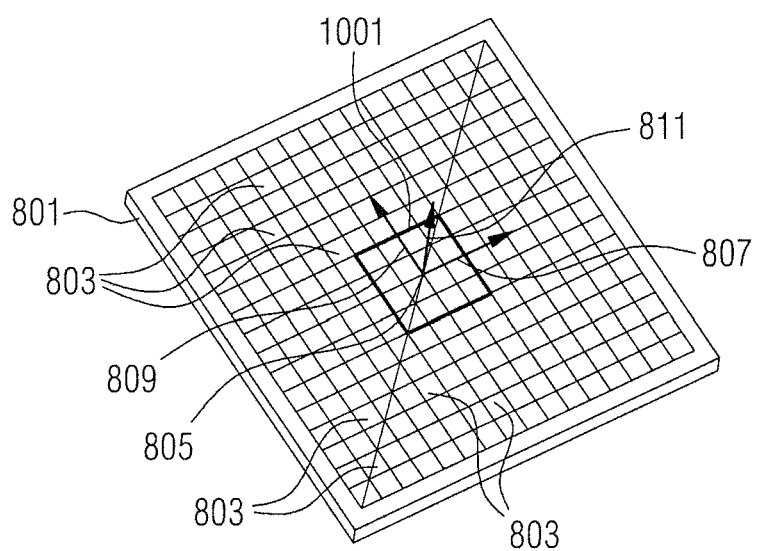
FIG. 10 shows a second operating state of the third optoelectronic semiconductor chip.

FIG. 10 shows the optoelectronic semiconductor chip 801 in a second operating state. In this case, only 4·4 light-emitting pixels 803 in the center of the semiconductor chip 801 are activated, that is to say that only these 16 light-emitting pixels are luminous. This region in the center of the semiconductor chip 801 is designated by the reference sign 1001.

Figure 11:
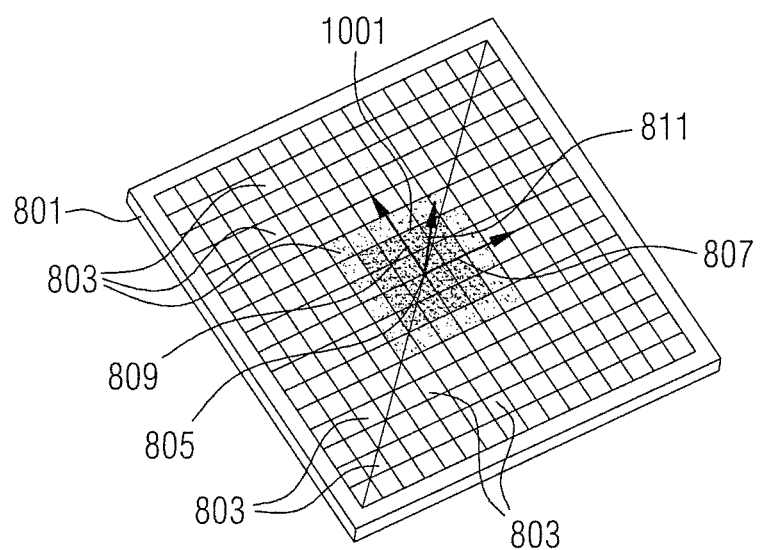
FIG. 11 shows an intensity distribution of the electromagnetic radiation emitted by means of the third optoelectronic semiconductor chip operated in the second operating state.

FIG. 11 shows the intensity distribution of the emitted light that corresponds to the second operating state.

Figure 12:
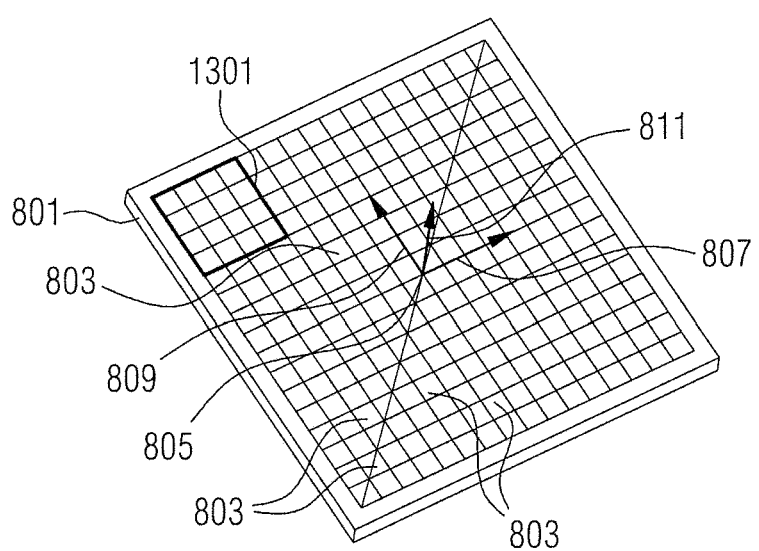
FIG. 12 shows a third operating state of the third optoelectronic semiconductor chip.

FIG. 12 shows the optoelectronic semiconductor chip 801 in a third operating state. In the third operating state, only 4·4 light-emitting pixels 803 in the top left corner of the semiconductor chip 801 relative to the plane of the drawing are activated. This region in the top left corner is identified by the reference sign 1301.

Figure 13:
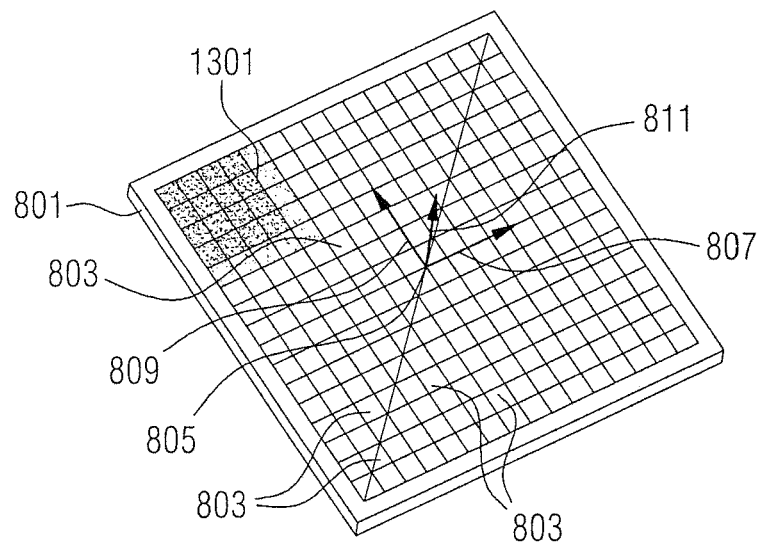
FIG. 13 shows an intensity distribution of the electromagnetic radiation emitted by the third optoelectronic semiconductor chip operated in the third operating state.

FIG. 13 shows the corresponding intensity distribution of the semiconductor chip 801 operated in the third operating state.

The light emitted by the semiconductor chip 801 is imaged onto an area by a projection optical unit in an analogous manner to that as described above, for example, in an exemplary way in association with FIG. 6.

The intensity distribution of the imaged light that corresponds to the three different operating states is referred to hereinafter as illuminance distribution.

Figure 14:
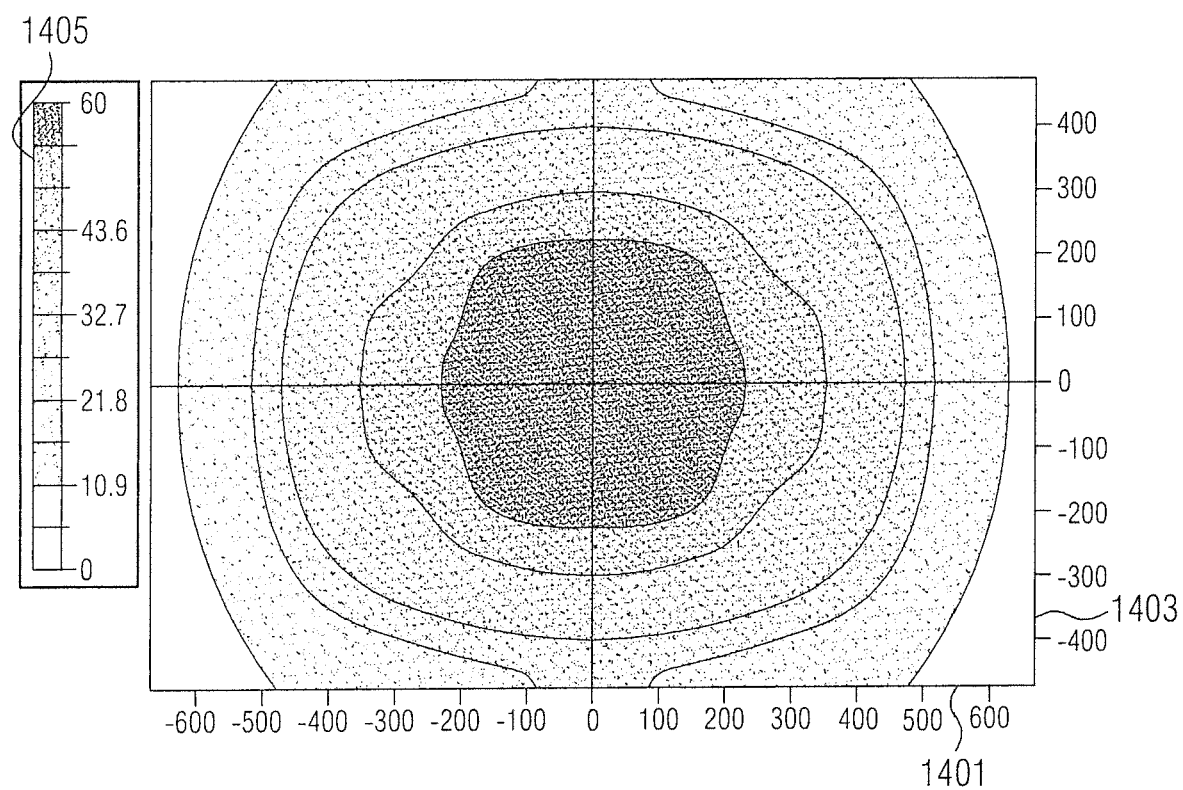
FIG. 14 shows an illuminance distribution of illumination light that results from an imaging by a projection optical unit of the electromagnetic radiation emitted by the third optoelectronic semiconductor chip operated in the first operating state.

FIG. 14 shows the illuminance distribution of electromagnetic radiation that was emitted by the semiconductor chip 801 operated in the first operating state and was imaged onto an area by a projection optical unit.

The reference sign 1401 points to the x-axis. The unit is millimeters. The reference sign 1403 points to the y-axis. The unit is millimeters. The point comprising the coordinates x=0 and y=0 corresponds to the mid-point of the semiconductor chip 801.

The original point light sources, that is to say the light-emitting pixels 803, now appear as a more homogeneous area relative thereto. That is to say that the area may be efficiently illuminated homogeneously and in particular color-homogeneously despite the use of a plurality of point light sources.

For the illuminance distribution illustrated in FIG. 14, max. lx/lm=0.22 holds true. lx stands for the maximum illuminance. lm stands for the luminous flux of the light emitted by means of the semiconductor chip 801. The values for lx as a function of x and y are illustrated as different hatchings. A scale comprising the reference sign 1405 indicates the values for lx in a manner corresponding to the hatchings depicted. The graph in accordance with FIG. 14 thus graphically shows the profile lx against x and y.

Figure 15:
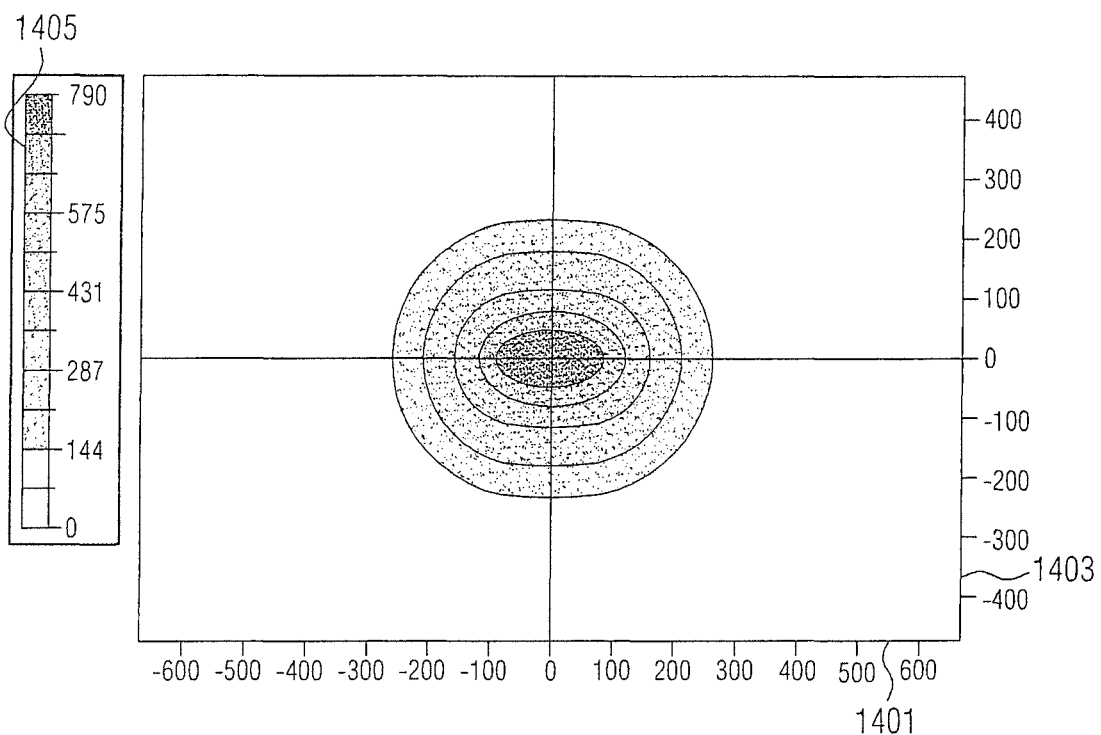
FIG. 15 shows an illuminance distribution of illumination light that results from an imaging by a projection optical unit of the electromagnetic radiation emitted by the third optoelectronic semiconductor chip operated in the second operating state.

FIG. 15 shows the corresponding illuminance distribution of the electromagnetic radiation that was emitted by the optoelectronic semiconductor chip 801 operated in the second operating state. The explanations given in association with FIG. 14 are analogously applicable.

Here, max. lx/lm=2.94.

Figure 16:
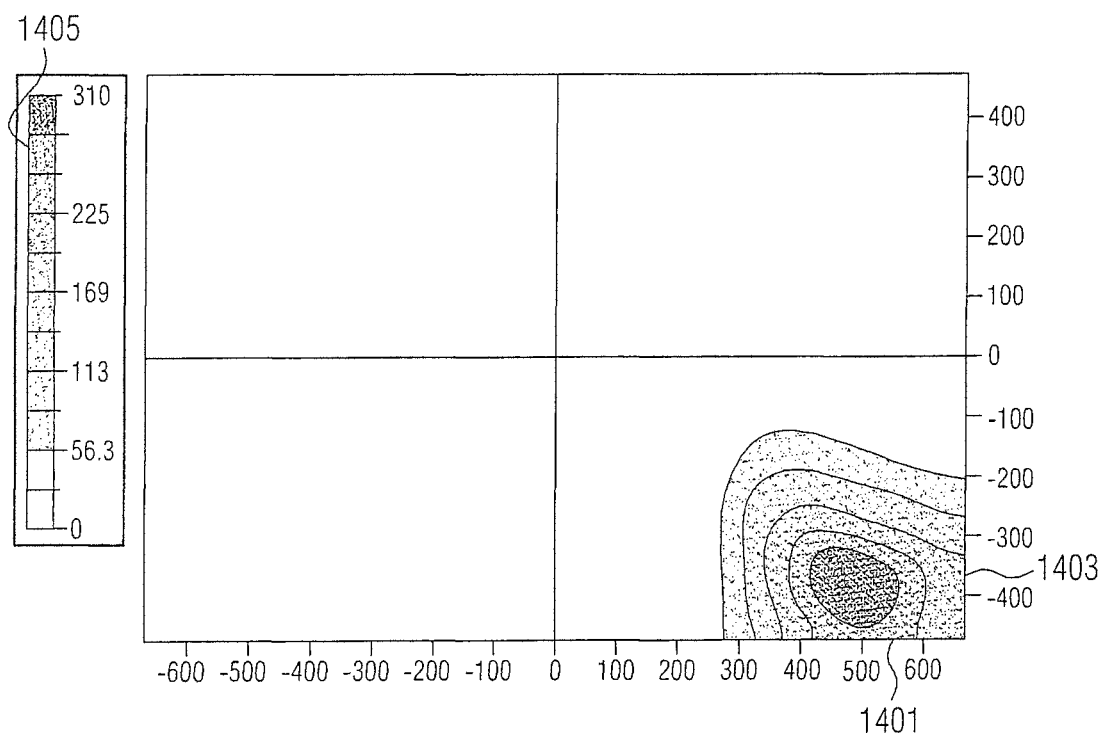
FIG. 16 shows an illuminance distribution of illumination light that results from an imaging by a projection optical unit of the electromagnetic radiation emitted by the third optoelectronic semiconductor chip operated in the third operating state.

FIG. 16 shows a corresponding illuminance distribution of the electromagnetic radiation that was emitted by the optoelectronic semiconductor chip 801 operated in the third operating state. The explanations given in association with FIG. 14 are analogously applicable.

Here, max. lx/lm=1.16.

Figure 17:
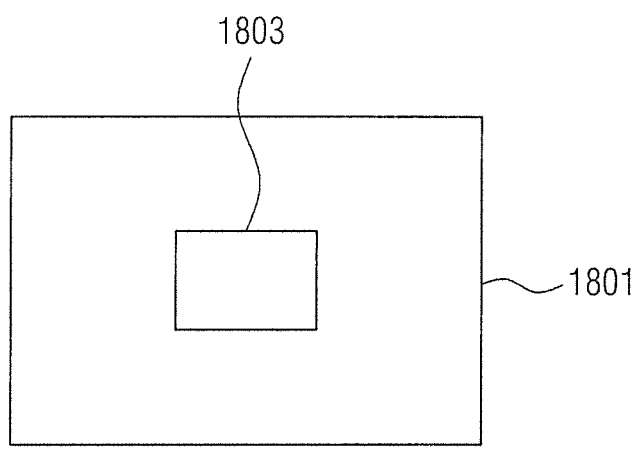
FIG. 17 shows a camera.

FIG. 17 shows a camera 1801 that records an image.

The camera 1801 comprises an example of an optoelectronic illumination system 1803.

Figure 18:
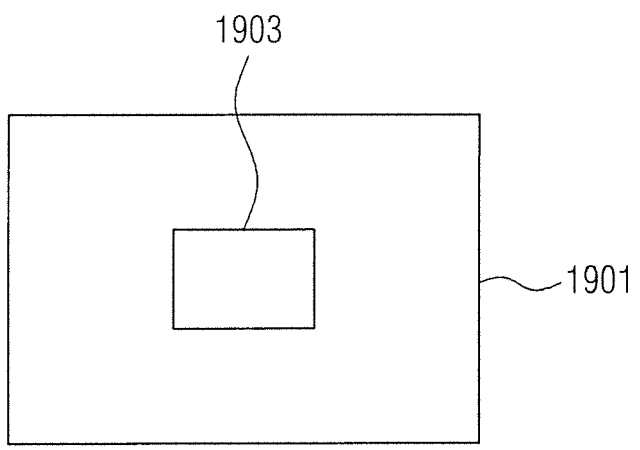
FIG. 18 shows a terminal.

FIG. 18 shows a terminal 1901 comprising an example of a camera 1903 that records an image.

The terminal 1901 is, for example, a mobile terminal, for example, a smartphone.

This disclosure therefore encompasses in particular the concept of providing a light-emitting diode comprising a continuous chip area (optoelectronic semiconductor chip comprising a plurality of individually drivable light-emitting pixels) and an adapted primary optical unit (projection optical unit), the emission color of which may be changed by suitable driving of the individual light-emitting pixels. As a result, an area to be illuminated, for example, in a cellular phone flash application, may advantageously be illuminated color-homogeneously in all operating states of the semiconductor chip. In particular, a two-lens projection optical unit is proposed.

That is to say therefore that an efficient color-homogeneous illumination may be brought about by a single chip (optoelectronic semiconductor chip) comprising an adjustable emission color, in combination with a compact projection optical unit.

My concepts may be used in particular in flash light applications and, according to one example, is actually used in such an application.

That is to say therefore that the optoelectronic illumination system is formed, for example, as a flash light system.

A reduction of the space requirement may advantageously be brought about since only one semiconductor chip is required instead of two semiconductor chips as conventionally hitherto.

Furthermore, a reduction in size and a homogenization of the appearance of the optical light emission face of the semiconductor chip are brought about.

Furthermore, a homogeneous appearance of the phosphors in the switched-off state of the semiconductor chip is advantageously brought about since the human eye may not resolve the individual light-emitting pixels with their phosphors and a homogeneous phosphor layer thus appears.

Figure 19:
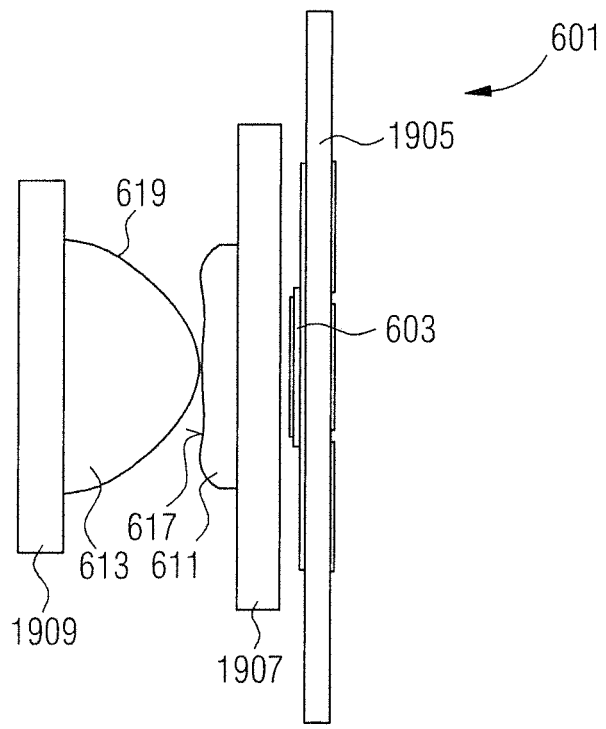
FIG. 19 shows the optoelectronic illumination system shown in FIG. 6 in a further view.

FIG. 19 shows the optoelectronic illumination system 601 shown in FIG. 6 in a further view.

The semiconductor chip 603 is arranged on a carrier 1905 which is, for example, a circuit board that electrically contacts the semiconductor chip 603.

The first lens element 611 is mounted by a first mount 1907, wherein the first mount 1907 is merely depicted schematically.

The second lens element 611 is mounted by a second mount 1909, wherein the second mount 1909 is merely depicted schematically.

The aperture stop 633 is not shown, for the sake of clarity.

Figure 20:
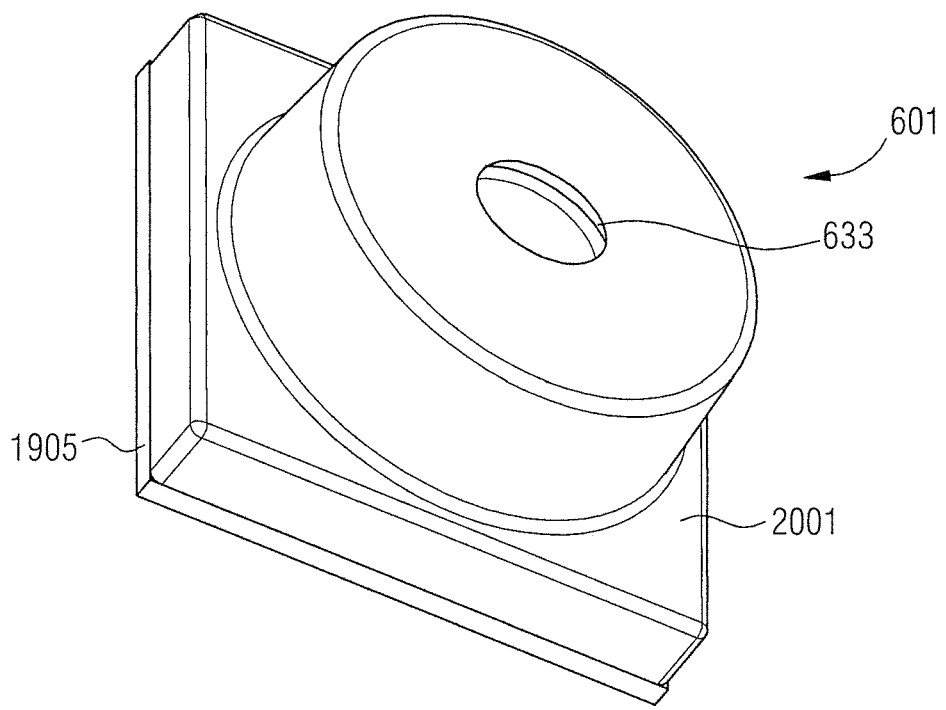
FIG. 20 shows the optoelectronic illumination system shown in FIG. 6 and/or respectively FIG. 19 in a housing.

FIG. 20 shows the optoelectronic illumination system 601 shown in FIG. 6 and/or respectively FIG. 19 in a housing 2001.

The aperture stop 633 is integrated, for example, in the housing 2001.

Figure 21:
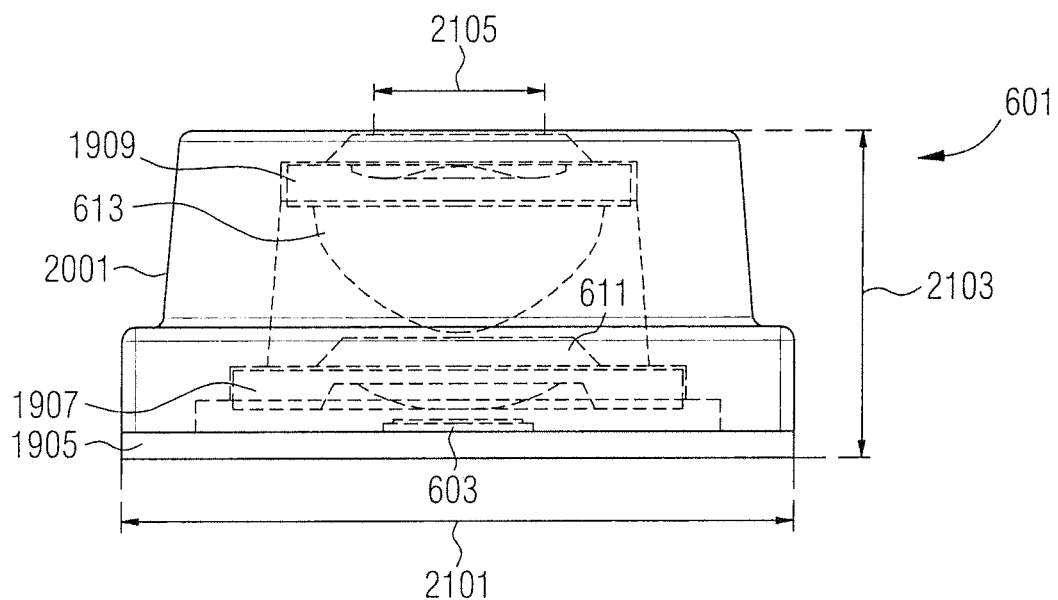
FIGS. 21 to 23 each show a view of the housed optoelectronic illumination system shown in FIG. 20.
Figure 22:
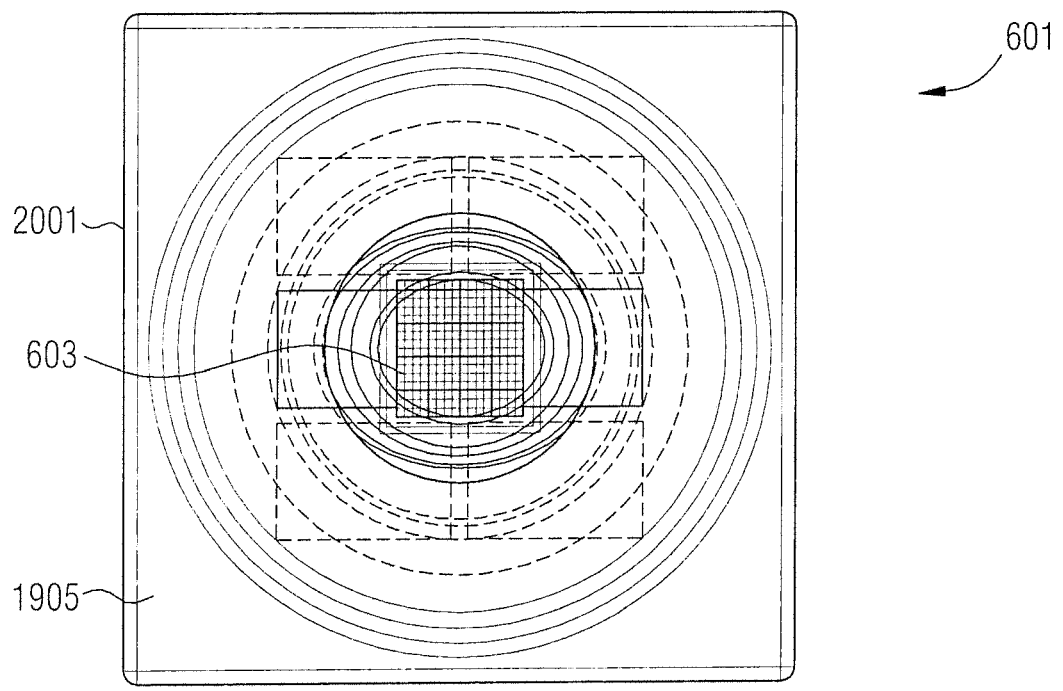
Figure 23:
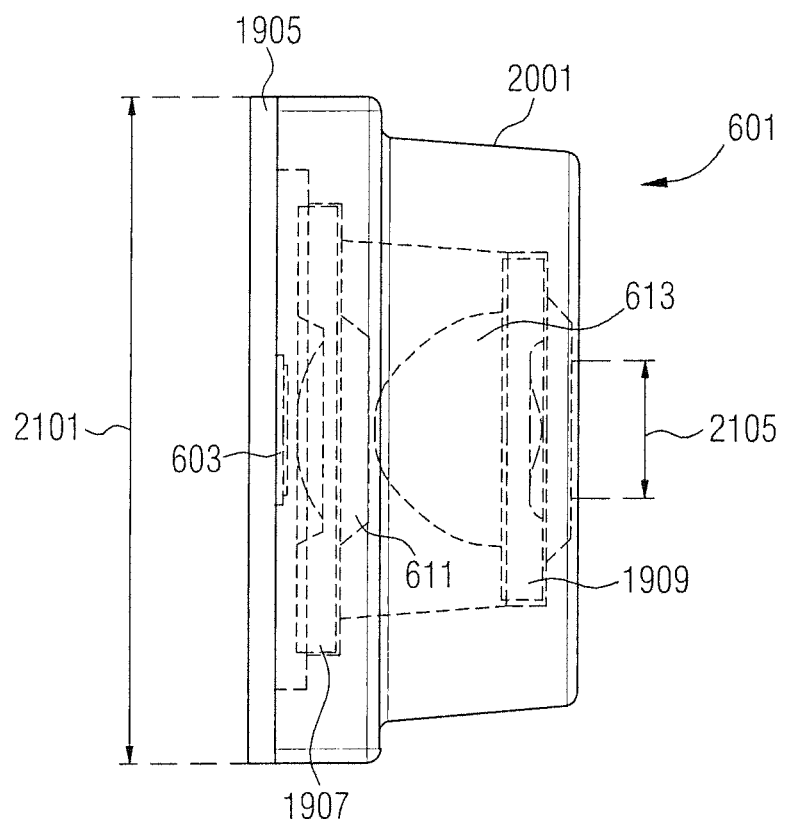

FIGS. 21 to 23 each show a view of the housed optoelectronic illumination system 601 shown in FIG. 20.

FIGS. 21 and 23 show a cross-sectional view. FIG. 22 shows a view from above.

A length of the carrier 1905 is identified by a dimensioning double-headed arrow comprising the reference sign 2101. The length of the carrier 1905 is 10 mm, for example.

The carrier 1905 is square, for example.

A height of the housing 2001 relative to the carrier 1905 is identified by a dimensioning double-headed arrow comprising the reference sign 2103. The height of the housing 2001 is 4.936 mm, for example.

A diameter of the aperture stop 633 is identified by a dimensioning double-headed arrow comprising the reference sign 2105. The diameter of the aperture stop 633 is, for example, 2.530 mm or, for example, 2.047 mm.

Figure 24:
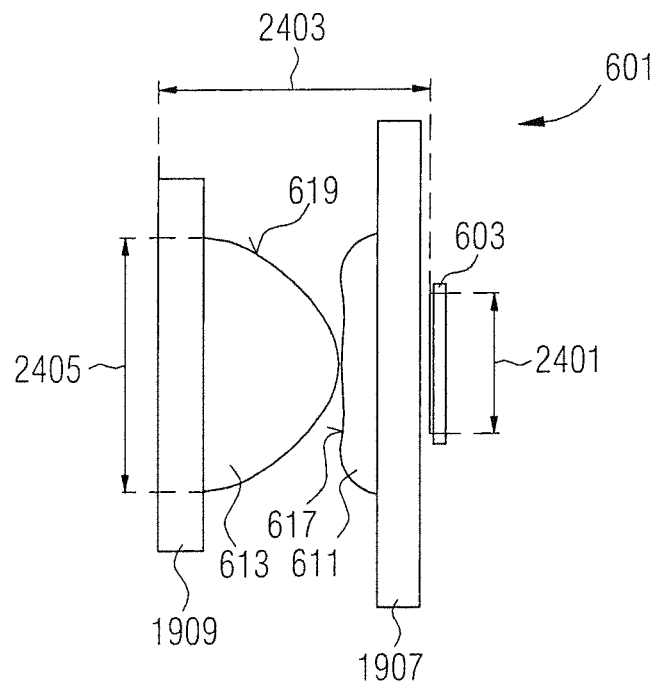
FIG. 24 shows the semiconductor chip and the two lens elements of the optoelectronic illumination system shown in FIG. 6 and/or respectively FIG. 19.

FIG. 24 shows the semiconductor chip 603 without a carrier 1905 and the two lens elements of the optoelectronic illumination system 601 shown in FIG. 6 and/or respectively FIG. 19.

A side length of the semiconductor chip 603 is identified by a dimensioning double-headed arrow comprising the reference sign 2401. The side length is designated hereinafter by Dc.

A distance between the semiconductor chip 603 and the second surface 621 of the second lens element 613 is identified by a dimensioning double-headed arrow comprising the reference sign 2403. This distance may also be referred to as the height of the projection optical unit. This distance is designated hereinafter by Dz.

A width of the second lens element 613 is identified by a dimensioning double-headed arrow comprising the reference sign 2405. This width is designated hereinafter by DL.

According to versions:
1 mm<Dc<4 mm or
Dc=2 mm or
1.4*Dc<Dz<2.4*Dc or
1.4*Dc<DL<2.0*Dc.

Although my units, chips, systems, cameras and terminals have been more specifically illustrated and described in detail by preferred examples, nevertheless this disclosure is not restricted by the examples disclosed and other variants may be derived therefrom by those skilled in the art, without departing from the scope of protection of the appended claims.

This application claims priority of DE 10 2016 104 385.0, the subject matter of which is incorporated herein by reference.

The invention claimed is:

1. A projection optical unit that images electromagnetic radiation emitted by an optoelectronic semiconductor chip comprising:
a first lens element,
a second lens element,
wherein the two lens elements each comprise a first light-refracting surface and a second light-refracting surface located opposite the first light-refracting surface,
the second light-refracting surface of the first lens element faces the first light-refracting surface of the second lens element,
the four light-refracting surfaces each comprise an asphere-shaped surface section such that the respective surface section forms an aspherical lens, and
the asphere-shaped surface section of each light-refracting surface is defined by formula:

$$z(r) = \frac{cr^2}{1+\sqrt{1-(1+k)c^2r^2}} + \alpha 1 r^2 + \alpha 2 r^4 + \alpha 3 r^6 + \alpha 4 r^8 + \alpha 5 r^{10} + \alpha 6 r^{12} + \alpha 7 r^{14} + \alpha 8 r^{16},$$

wherein c denotes a vertex curvature, where c=1/R, R is a vertex radius, k denotes a conic constant, $\alpha 1$, $\alpha 2$, $\alpha 3$, $\alpha 4$, $\alpha 5$, $\alpha 6$, $\alpha 7$ and $\alpha 8$ are asphere coefficients, z is a sagitta and r is a radial distance from an optical axis of an aspherical lens.

2. The projection optical unit according to claim 1, wherein one or a plurality of the aspherical lenses each comprise a shape of a plane asphere.

3. The projection optical unit according to claim 1, wherein the aspherical lens of the first surface of the first lens element is defined by formula:

$$z(r) = \frac{cr^2}{1+\sqrt{1-(1+k)c^2r^2}} + \alpha 1 r^2 + \alpha 2 r^4 + \alpha 3 r^6 + \alpha 4 r^8 + \alpha 5 r^{10} + \alpha 6 r^{12} + \alpha 7 r^{14} + \alpha 8 r^{16},$$

wherein z is the sagitta in mm, r is the radial distance from the optical axis of the first lens element, c is the vertex curvature where c=1/R, R is the vertex radius where R=−5.187 mm+/−10%, k is the conic constant where k=8.381+/−10%, $\alpha 1$=0.000+/−0.001, $\alpha 2$=−0.005+/−10%, $\alpha 3$=−0.011+/−10%, $\alpha 4$=−0.001+/−10%, $\alpha 5$=0.0001+/−10%, $\alpha 6$=0.0002+/−10%, $\alpha 7$=0.0003+/−10%, $\alpha 8$=−2.092e-005+/−10%.

4. The projection optical unit according to claim 1, wherein the aspherical lens of the second surface of the first lens element is defined by formula:

$$z(r) = \frac{cr^2}{1+\sqrt{1-(1+k)c^2r^2}} + \alpha 1 r^2 + \alpha 2 r^4 + \alpha 3 r^6 + \alpha 4 r^8 + \alpha 5 r^{10} + \alpha 6 r^{12} + \alpha 7 r^{14} + \alpha 8 r^{16},$$

wherein z is the sagitta in mm, r is the radial distance from the optical axis of the first lens element, c is the vertex curvature where c=1/R, R is the vertex radius where R=3.426 mm+/−10%, k is the conic constant where k=−8.413+/−10%, $\alpha 1$=0.000+/−0.001, $\alpha 2$=−0.124+/−10%, $\alpha 3$=0.013+/−10%, $\alpha 4$=0.010+/−10%, $\alpha 5$=−5.688e-005+/−10%, $\alpha 6$=−0.0002+/−10%, $\alpha 7$=−0.0001+/−10%, $\alpha 8$=1.605e-005+/−10%.

5. The projection optical unit according to claim 1, wherein the aspherical lens of the first surface of the second lens element is defined by formula:

$$z(r) = \frac{cr^2}{1+\sqrt{1-(1+k)c^2r^2}} + \alpha 1 r^2 + \alpha 2 r^4 + \alpha 3 r^6 + \alpha 4 r^8 + \alpha 5 r^{10} + \alpha 6 r^{12} + \alpha 7 r^{14} + \alpha 8 r^{16},$$

wherein z is the sagitta in mm, r is the radial distance from the optical axis of the first lens element, c is the vertex curvature where c=1/R, R is the vertex radius where R=−1.316 mm+/−10%, k is the conic constant, where k=−0.595+/−10%, $\alpha 1$=0.000+/−0.001, $\alpha 2$=0.028+/−10%, $\alpha 3$=−0.003+/−10%, $\alpha 4$=0.001+/−10%, $\alpha 5$=0.0006+/−10%, $\alpha 6$=9.062e-006+/−10%, $\alpha 7$=2.451e-006+/−10%, $\alpha 8$=−1.130e-005+/−10%.

6. The projection optical unit according to claim 1, wherein the aspherical lens of the second surface of the second lens element is defined by formula:

$$z(r) = \frac{cr^2}{1+\sqrt{1-(1+k)c^2r^2}} + \alpha 1 r^2 +$$
$$\alpha 2 r^4 + \alpha 3 r^6 + \alpha 4 r^8 + \alpha 5 r^{10} + \alpha 6 r^{12} + \alpha 7 r^{14} + \alpha 8 r^{16},$$

wherein z is the sagitta in mm, r is the radial distance from the optical axis of the first lens element, c is the vertex curvature where c=1/R, R is the vertex radius where R=2.923 mm+/−10%, k is the conic constant where k=1.617+/−10%, α1=0.000+/−0.001, α2=0.044+/−10%, α3=−0.077+/−10%, α4=−0.009+/−10%, α5=0.006+/−10%, α6=0.003+/−10%, α7=0.0009+/−10%, α8=−0.001+/−10%.

7. The projection optical unit according to claim 1, wherein one or a plurality of the aspherical lenses each comprise a shape corresponding to a respective stretching of a rotationally symmetrical configuration of the corresponding aspherical lens around the lens centroid of the corresponding aspherical lens by a first stretching factor of 1.1+/−10% in a radial first stretching direction and a second stretching factor of 0.89+/−10% in a radial second stretching direction extending perpendicularly to the first stretching direction.

8. The projection optical unit according to claim 1, wherein at least one of the two lens elements or both lens elements is and/or respectively are each an injection-molded component, in particular an injection-molded component comprising polycarbonate.

9. An optoelectronic illumination system comprising the optoelectronic projection optical unit according to claim 1 and an optoelectronic semiconductor chip comprising:
 a plurality of individually drivable light-emitting pixels that each comprise a semiconductor layer sequence comprising an active zone that generates electromagnetic radiation,
 wherein the light-emitting pixels are respectively assigned a phosphor for a wavelength conversion of the electromagnetic radiation generated in the respective active zone, and
 the assigned phosphors in part each comprise a different conversion property.

10. The optoelectronic illumination system according to claim 9, wherein the assigned phosphors are applied on a respective top surface of the semiconductor layer sequences.

11. The optoelectronic illumination system according to claim 9, wherein two phosphors each comprises a different conversion property are provided, and the two phosphors are assigned to the light-emitting pixels in a manner corresponding to a checkered pattern.

12. The optoelectronic illumination system according to claim 9, wherein the phosphors are assigned to the light-emitting pixels in a manner corresponding to a pattern defined on the basis of the respective conversion properties.

13. The optoelectronic illumination system according to claim 9, wherein the light-emitting pixels are arranged in a matrix comprising columns and rows, and 16 light-emitting pixels are provided per column and per row.

14. The optoelectronic illumination system according to claim 9, wherein the semiconductor chip comprises a square shape comprising an edge length of 2.0 mm+/−10%.

15. The optoelectronic illumination system according to claim 9, wherein one of the conversion properties comprises a wavelength conversion of the electromagnetic radiation generated in the respective active zone into electromagnetic radiation comprising a color temperature of 6000 K+/−800 K such that the correspondingly converted electromagnetic radiation comprises a hue of Cx=0.30 to Cx=0.37 and of Cy=0.29 to Cy=0.37 of the CIE standard colorimetric system, and another of the conversion properties comprises a wavelength conversion of the electromagnetic radiation generated in the respective active zone into electromagnetic radiation comprising a color temperature of 2250 K+/−500 K such that the correspondingly converted electromagnetic radiation comprises a hue of Cx=0.45 to Cx=0.55 and of Cy=0.40 to Cy=0.48 of the CIE standard colorimetric system.

16. A camera for recording an image, comprising an illumination system according to claim 9.

17. A terminal comprising a camera according to claim 16.

18. The terminal according to claim 17, wherein the terminal is a mobile terminal.

19. The projection optical unit according to claim 1, wherein α6, α7 and α8 are nonzero.

* * * * *